(12) United States Patent
Fujisawa et al.

(10) Patent No.: US 6,836,025 B2
(45) Date of Patent: Dec. 28, 2004

(54) SEMICONDUCTOR DEVICE CONFIGURED TO BE SURFACE MOUNTABLE

(75) Inventors: Tetsuya Fujisawa, Kawasaki (JP); Hirohisa Matsuki, Kawasaki (JP); Osamu Igawa, Kawasaki (JP); Yoshitaka Aiba, Kawasaki (JP); Masamitsu Ikumo, Kawasaki (JP); Mitsutaka Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/448,444

(22) Filed: May 30, 2003

(65) Prior Publication Data

US 2003/0227095 A1 Dec. 11, 2003

(30) Foreign Application Priority Data

May 31, 2002 (JP) .......................................... 2002-158997
Oct. 30, 2002 (JP) .......................................... 2002-316076
May 2, 2003 (JP) .......................................... 2003-127344

(51) Int. Cl.[7] .............................................. H01L 23/48
(52) U.S. Cl. ..................... 257/782; 257/686; 257/723; 257/786; 257/698; 257/777
(58) Field of Search ................................. 257/782, 777, 257/686, 723, 784, 786, 733, 738, 698, 696, 691, 211, 208, 207

(56) References Cited

U.S. PATENT DOCUMENTS

2001/0026021 A1 * 10/2001 Honda ........................ 257/778

FOREIGN PATENT DOCUMENTS

| JP | 5-206368 | 8/1993 |
|----|----------|--------|
| JP | 6-260564 | 9/1994 |
| JP | 7-86502 | 3/1995 |
| JP | 9-260581 | 10/1997 |
| JP | 2001-217381 | 8/2001 |
| JP | 2001-298149 | 10/2001 |
| JP | 2001-320015 | 11/2001 |
| JP | 2001-332643 | 11/2001 |
| JP | 2002-110714 | 4/2002 |
| JP | 2002-170714 | 6/2002 |

* cited by examiner

*Primary Examiner*—Nathan J. Flynn
*Assistant Examiner*—Remmon R. Fordé
(74) *Attorney, Agent, or Firm*—Westerman, Hattori, Daniels & Adrian, LLP

(57) ABSTRACT

In a semiconductor device circuit formation surfaces of each of a plurality of semiconductor chips can be easily located at even level when the semiconductor chips are arranged side by side so that a process of forming rearrangement wiring is simplified. The semiconductor chips are mounted on a substrate via an adhesive layer in a two-dimensional arrangement. A resin layer is formed on the substrate and located around the semiconductor elements. The resin layer has the same thickness as a thickness of the semiconductor elements. An organic insulating layer is formed over a surface of the resin layer and circuit formation surfaces of the semiconductor elements. A rearrangement wiring layer is formed on the organic insulating layer and electrodes of the semiconductor chips. External connection terminals are electrically connected to the circuit formation surfaces of the semiconductor elements through wiring in the rearrangement wiring layer.

16 Claims, 21 Drawing Sheets

FIG.6
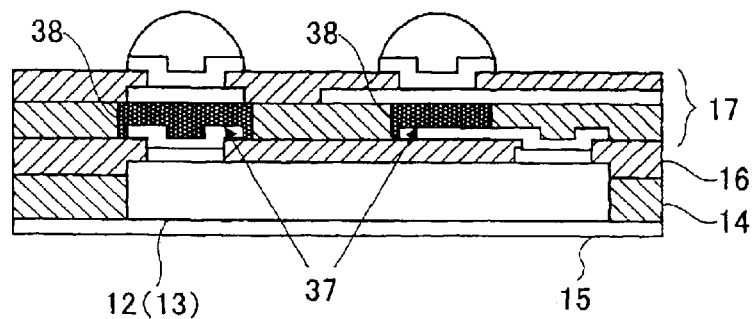
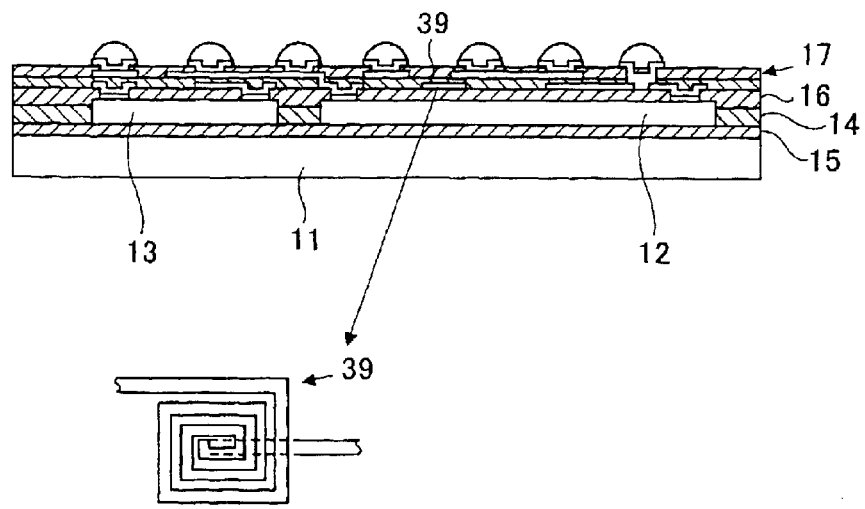
FIG.7A
FIG.7B

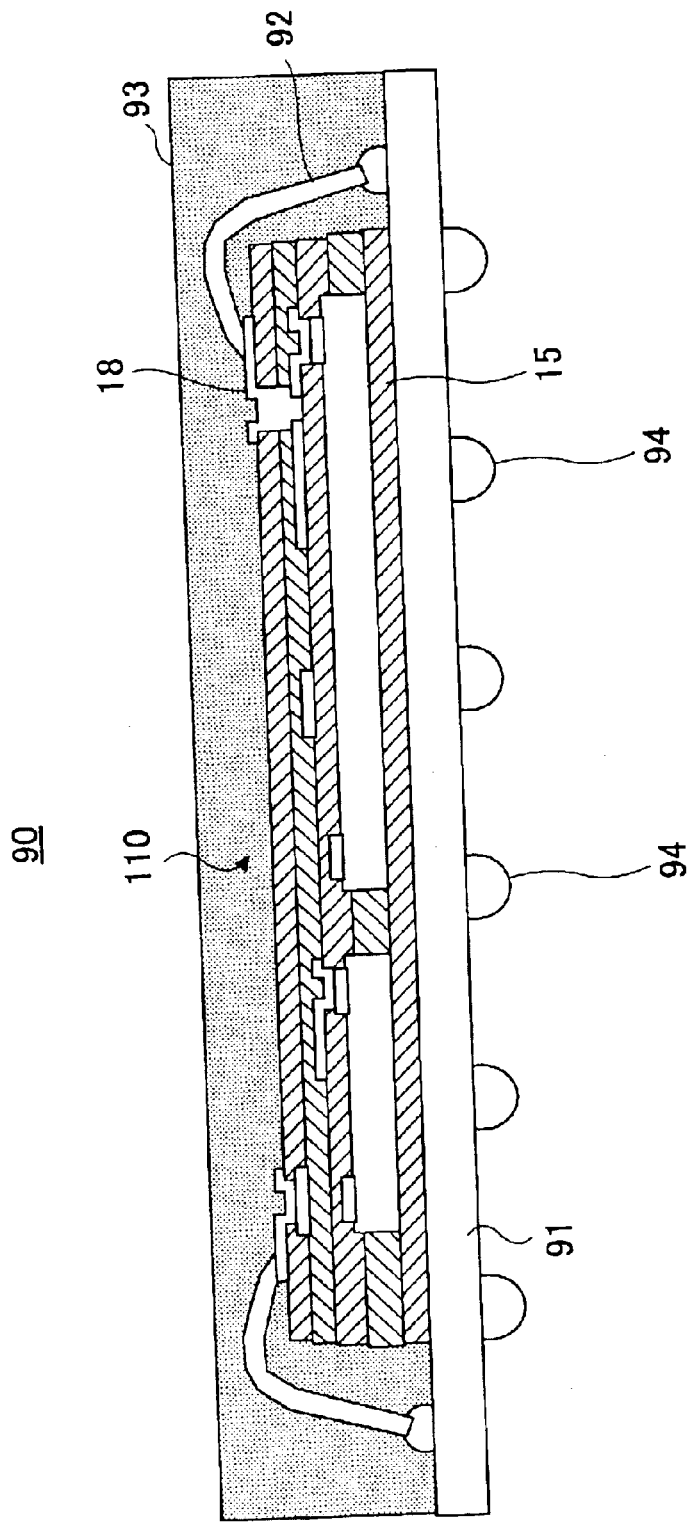

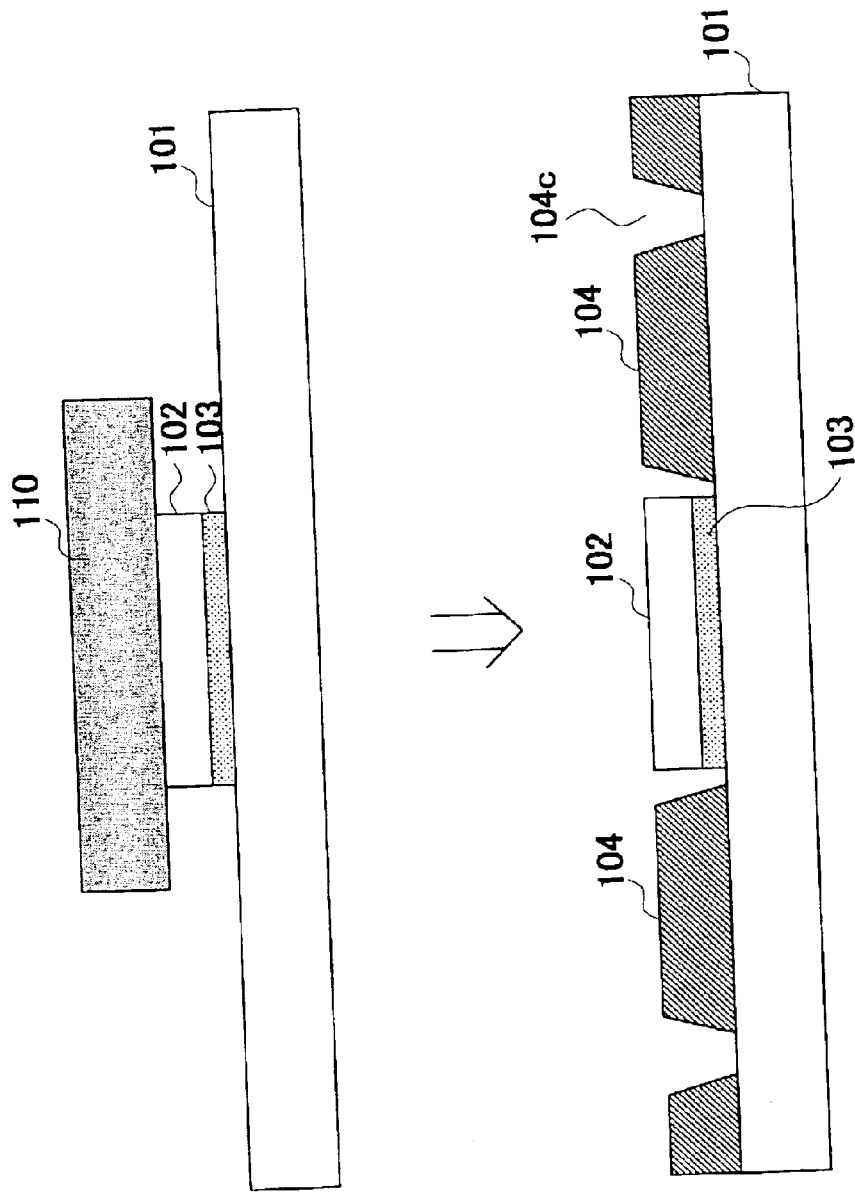

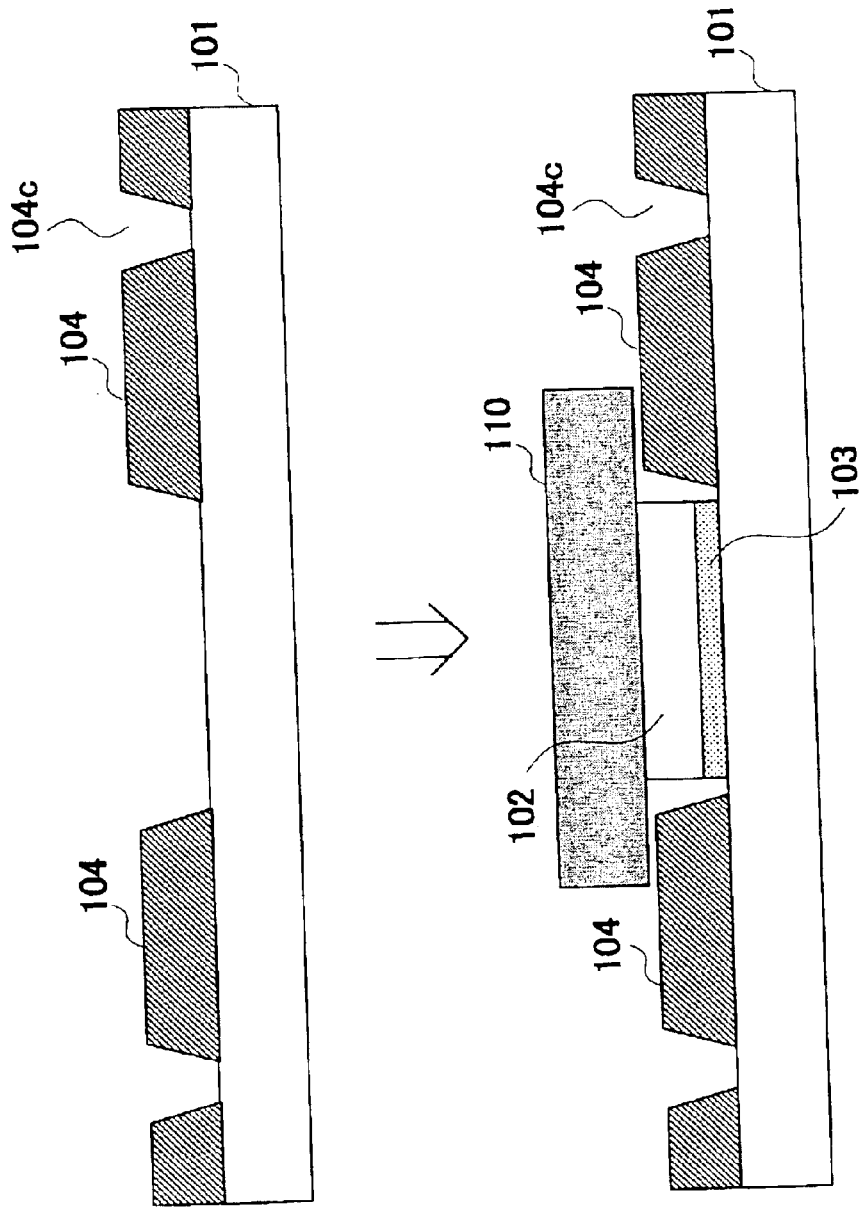

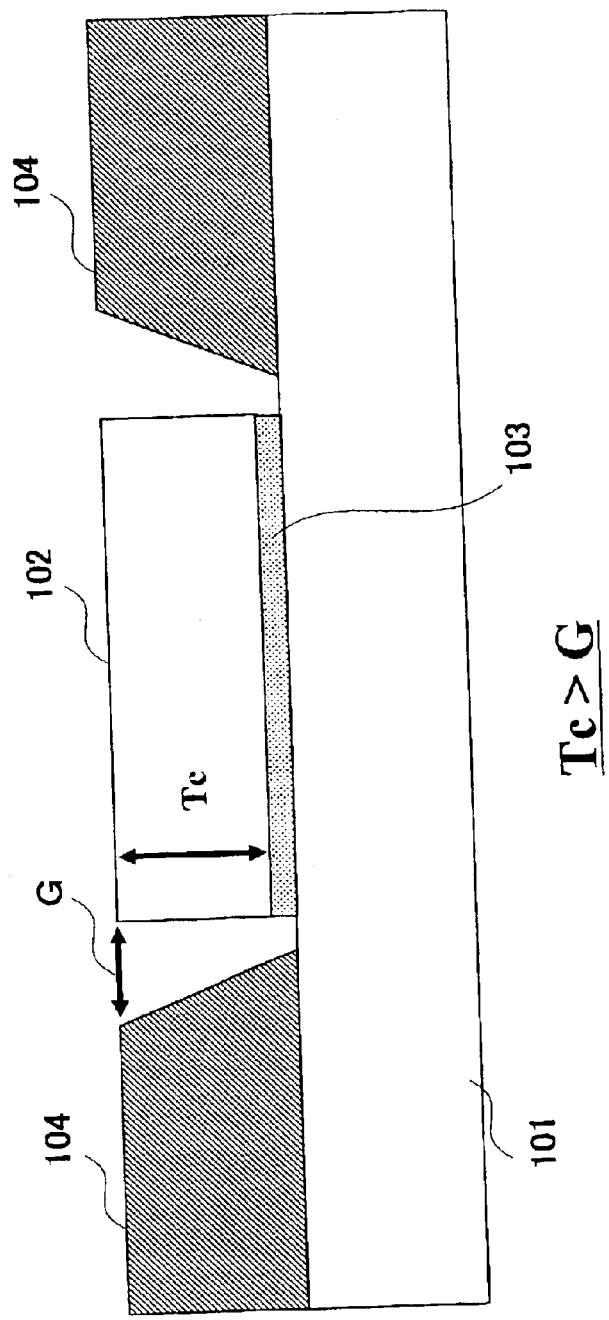

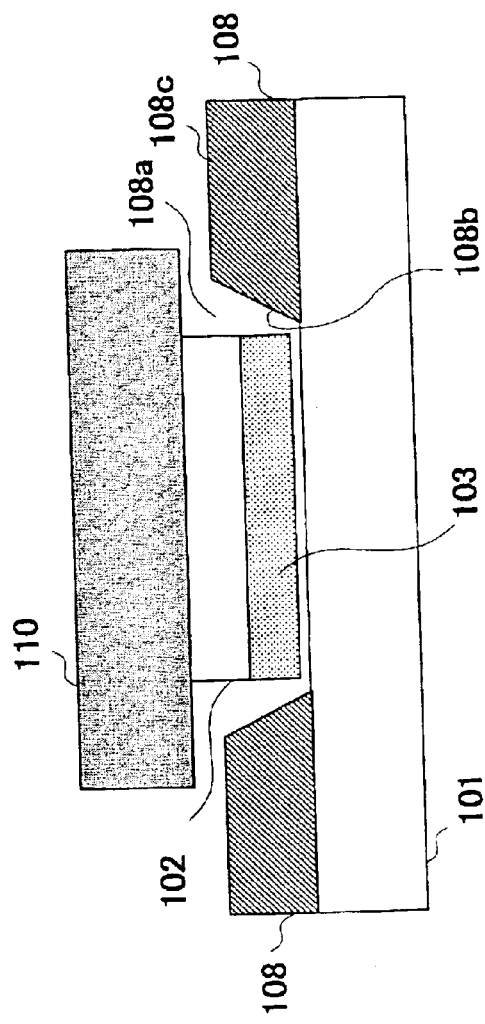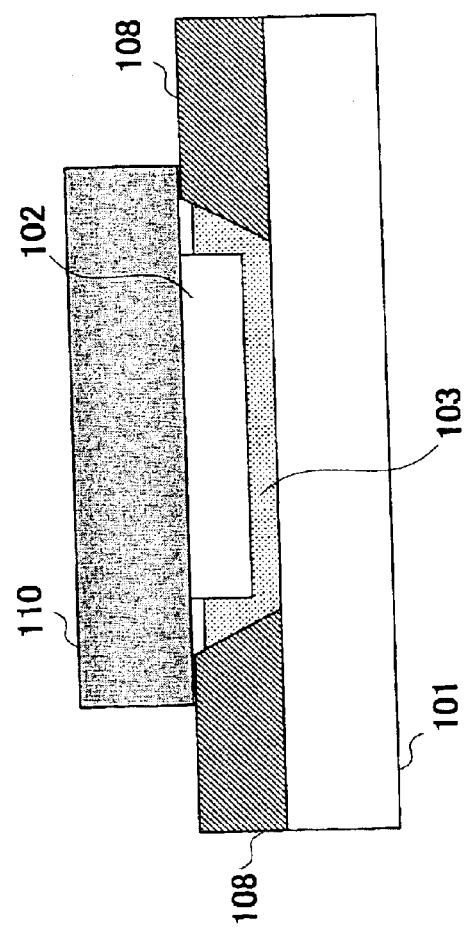
FIG.25A
FIG.25B

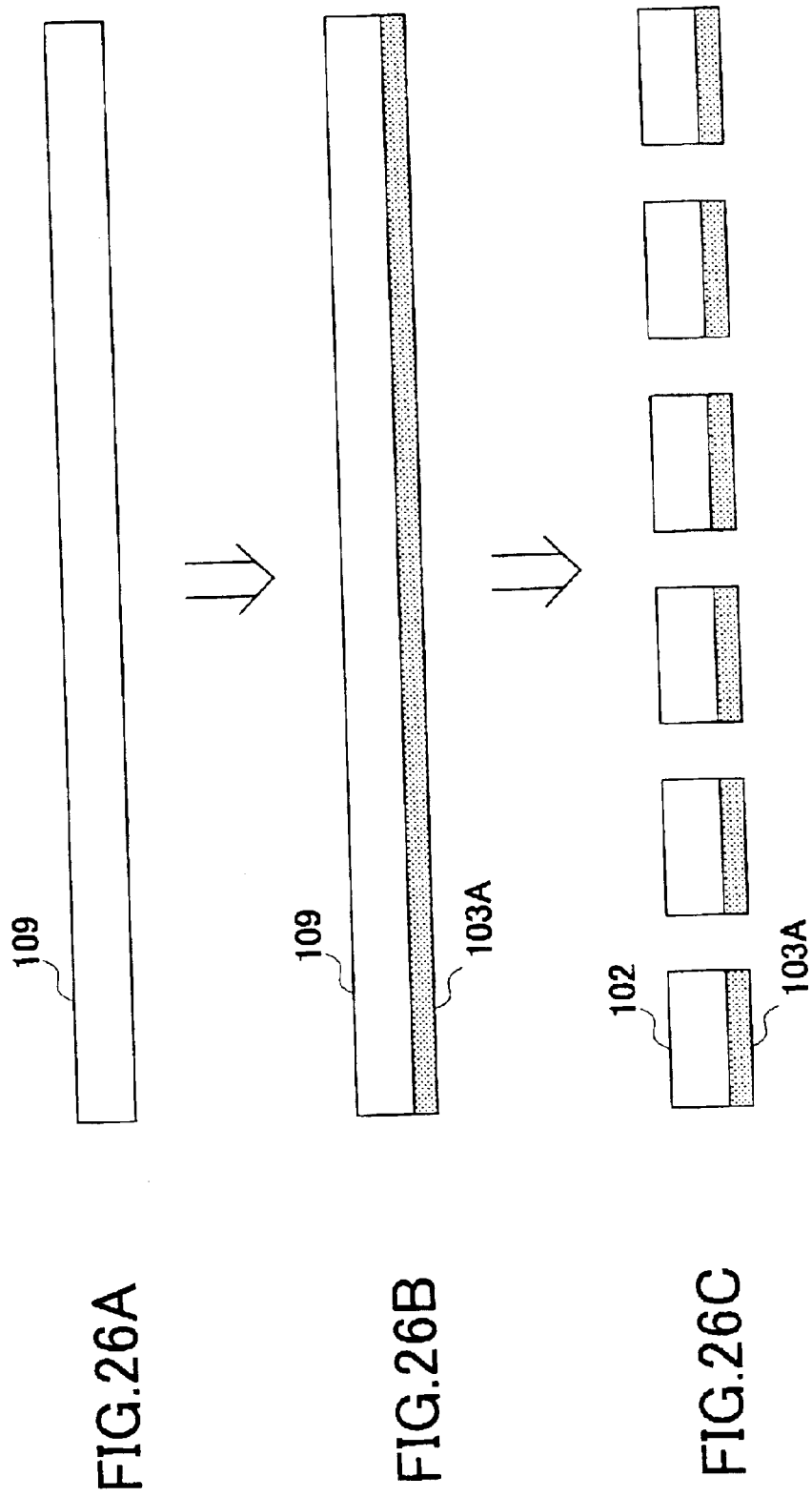

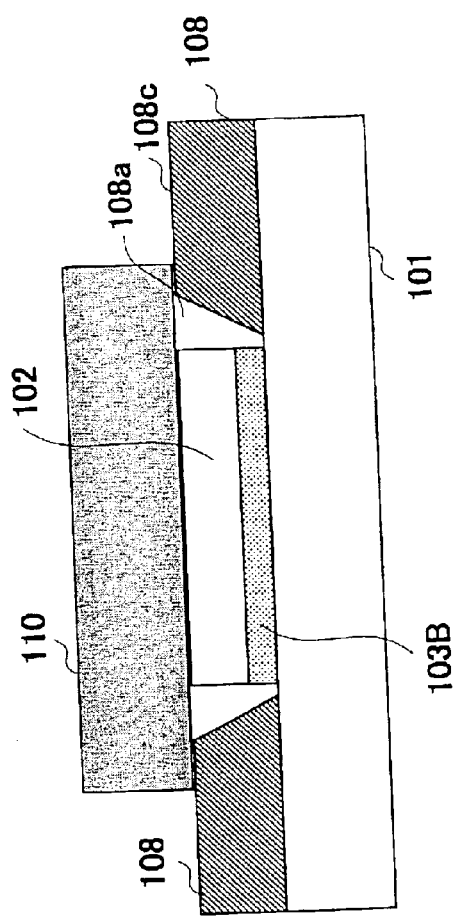
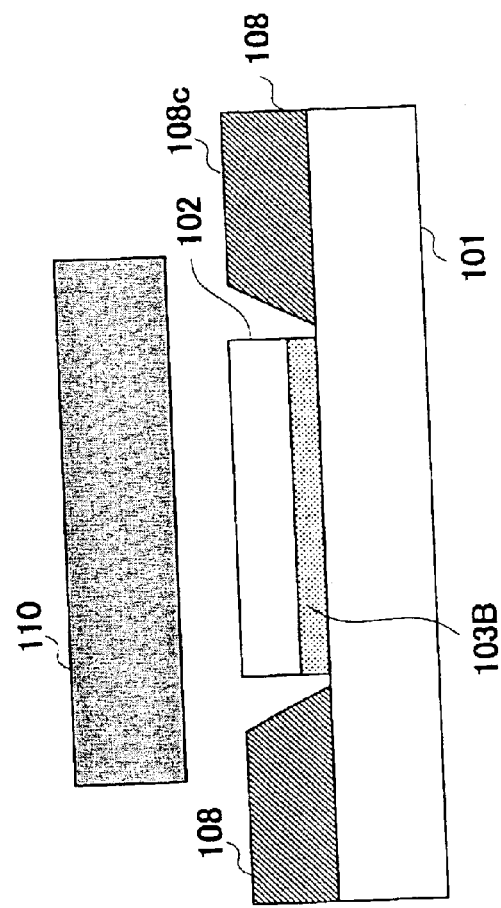
FIG.27A
FIG.27B

SEMICONDUCTOR DEVICE CONFIGURED TO BE SURFACE MOUNTABLE

CROSS-REFERENCE TO RELATED APPLICATIONS

The present invention is based on Japanese priority applications No. 2002-158997 filed May 31, 2002, No. 2002-316076 filed Oct. 30, 2002 and No. 2003-127344 filed May 2, 2003, the entire contents of which are hereby incorporated by reference.

BACKGROUND OF THE INVENTION

1. Field of the Invention

The present invention generally relates to semiconductor devices and, more particularly, to a semiconductor device configured to be surface-mountable and manufacturing method thereof.

2. Description of the Related Art

In recent years, high-densification of semiconductor chips has progressed remarkably, and the size of semiconductor chips has been reduced. In connection with this, high-densification and high-functionalization of semiconductor devices have progressed, and a technique has been developed to integrally incorporate a plurality of semiconductor chips into one semiconductor device. For example, there is a semiconductor device in which a plurality of semiconductor chips of different kinds and functions are connected to each other and external connection electrodes are provided.

Although there is a multi-chip module (MCM) as one example which accommodates a plurality of semiconductor chips in one package, such a conventional MCM does not have a fine structure that is the same as a semiconductor chip having a recently developed fine structure.

Japanese Laid-Open Patent Application No. 2001-217381 discloses an example of a technique to accommodate a plurality of semiconductor chips in one package. With the technique disclosed in this patent document, a plurality of semiconductor chips are arranged on a mounting jig and copper posts are formed on electrodes of each semiconductor chip. Then, the semiconductor chips together with the copper posts are encapsulated by a seal resin using transfer molding, and a surface of the seal resin is grinded so as to expose the copper posts. After forming wiring (rearrangement wiring) on the surface of the seal resin on which the copper posts are exposed, external connection electrodes are formed on the rearrangement wiring.

Japanese Laid-Open Patent Application No. 2001-332643 discloses a technique similar to that disclosed in the above-mentioned patent document. This patent document discloses formation of a protective film on a back surface of each semiconductor chip.

Additionally, Japanese Laid-Open Patent Application No. 7-86502 discloses a technique wherein a plurality of semiconductor chips are accommodated in a recess formed in a substrate and rearrangement wiring is formed on the semiconductor chips and then external connection terminals are formed on the rearrangement wiring. With this technique, the depth of the recess is so that the circuit formation surface of each semiconductor chip aligns with the surface of the substrate.

Further, Japanese Laid-Open Patent Application No. 2002-110714 discloses a technique wherein a plurality of semiconductor chips are arranged with the circuit formation surfaces facing downward and a resin is filled between the semiconductor chips while setting the circuit formation surfaces of the semiconductor chips to be a flat surface by covering the back surfaces and side surfaces of the semiconductor chips. Thereafter, rearrangement wiring is formed on the side of the circuit formation surfaces so as to form external connection terminals.

Moreover, Japanese Laid-Open Patent Application No. 5-206368 discloses a technique wherein a plurality of semiconductor chips are mounted on a thermally conductive substrate, an insulating resin is filled between the chips and rearrangement wiring is formed by aluminum on the circuit formation surfaces.

Although the above-mentioned conventional technique is constituted by mounting a plurality of semiconductor chips in a side-by-side arrangement, many kinds of stack-type semiconductor devices, in which a plurality of semiconductor chips are stacked, have been developed.

As examples of document disclosing a stack-type semiconductor device, there are Japanese Laid-Open Patent Applications No. 2001-298149 and No. 2001-320015.

With the technology disclosed in Japanese Laid-Open Patent Application No. 2001-298149, an upper semiconductor chip is mounted inside a pad area (peripheral-arranged electrodes) of a lower semiconductor chip on which the upper semiconductor chip is stacked. Additionally, with the technique disclosed in Japanese Laid-Open Patent Application No. 2001-320015, conductive pillars (column-shaped metal members) are provided on a wiring layer on each of the stacked semiconductor chips.

With the technique disclosed in the above-mentioned Japanese Laid-Open Patent Applications No. 2001-217381 and No. 2001-332643, the semiconductor chips are encapsulated by a seal resin using transfer molding, and, thus, a pressure applied during the transfer molding may have an adverse affect on the semiconductor chips. Additionally, a large force may be exerted on the semiconductor chips also at the time of grounding of the seal resin surface after molding. Further, when the semiconductor chips are stacked, warp may occur due to contraction at the time of curing the seal resin on a mounting substrate (silicon wafer). Such a warp may have an adverse affect when the semiconductor chips are stacked.

Laid-Open Patent Application No. 7-86502, a high accuracy is required in the depth of the recess when forming the recess which accommodates semiconductor chips. Particularly, if the semiconductor chips become thin, a higher accuracy is required in the depth of the recess, which may be difficult to achieve.

Further, with the technique disclosed in Japanese Laid-Open Patent Application No. 2002-110714, a resin is provided on the back side of semiconductor chips, which causes a problem of poor heat radiation characteristic of the semiconductor chips. Moreover, warpage may occur in the semiconductor device due to the resin being cured on the back side of the semiconductor chips.

Moreover, according to the technique disclosed in Japanese Laid-Open Patent Applications No. 2002-110714 and No. 5-206368, a resin is filled between semiconductor chips after arranging the semiconductor chips at predetermined positions, and, thus, there may be a case in which a displacement of the semiconductor chips occurs when mounting the semiconductor chips or filling the resin. With this technique, it is impossible to remove the displaced chip.

Further, with respect to stacked type semiconductor device, in the technique disclosed in Japanese Laid-Open Patent Application No. 2001-298149, an upper semiconductor chip is mounted inside the pad area (peripheral arrangement electrode) of the lower semiconductor chip on which the upper semiconductor chip is stacked, semiconductor chips having the same size cannot be stacked. Moreover, with the technique disclosed in Japanese Laid-Open Patent Application No. 2001-320015, the manufacturing cost of a semiconductor device is increased due to the formation of the conductive pillars.

In the meantime, a semiconductor device which is formed by stacking semiconductor chips, generally the semiconductor chip is securely fixed to a substrate by covering the circumference of the semiconductor chip. Additionally, in a case where a plurality of semiconductor chips are mounted on a substrate such as a multi-chip module, a resin is filled between the semiconductor chips as disclosed in Japanese Laid-Open Patent Application No. 2002-110714. With such a filled resin layer, each semiconductor chip can be securely fixed to the substrate, and the semiconductor chips are insulated to each other.

The filled resin layer can be previously formed prior to mounting the semiconductor chips onto the substrate, or the resin may be filled after mounting the semiconductor chips onto the substrate.

When the above-mentioned filled resin layer is formed prior to mounting the semiconductor chip, a part of the filled resin layer formed on the substrate is removed so as to form an opening in which the surface of the substrate is exposed, and the semiconductor chip is mounted by being placed in the opening. Accordingly, the opening is formed with a size slightly larger than the outer configuration of the semiconductor chip.

Additionally, there is a method of forming the filled resin layer after the semiconductor chip is mounted, in which a resin is cured after being applied onto the substrate on which the semiconductor chip is mounted and masked. Also in this case, it is difficult to tightly contact the filled resin layer with the side surfaces of the semiconductor chip, and a gap may be formed between the filled resin layer and side surfaces of the semiconductor chips.

If such a gap is formed between the filled resin layer and the side surfaces of the semiconductor chip, a sufficient fixation effect to the semiconductor chip by the filled resin layer cannot be achieved. Additionally, such a gap may be an obstacle for formation of wiring on the semiconductor chip and the filled resin layer. When a insulating resin layer is formed on the semiconductor chip and the filled resin layer, the insulating resin enters the gap and the gap is filled by the insulating resin in the step of forming the insulating resin layer. However, the entire gap cannot be filled with the insulating resin.

SUMMARY OF THE INVENTION

It is a general object of the present invention to provide an improved and useful semiconductor device in which the above-mentioned problems are eliminated.

A more specific object of the present invention is to provide a semiconductor device and manufacturing method thereof in which circuit formation surfaces of each of a plurality of semiconductor chips can be easily located at even level when the semiconductor chips are arranged side by side so that a process of forming rearrangement wiring is simplified.

Another object of the present invention is to provide a semiconductor device and a manufacturing method thereof in which semiconductor chips having the same size can be easily stacked with a thin wiring layer formed therebetween.

Another object of the present invention is to provide a semiconductor device and manufacturing method thereof in which a filled resin layer tightly contact with side surfaces of a semiconductor chip.

In order to achieve the above-mentioned object, there is provided according to one aspect of the present invention a semiconductor device, comprising: a plurality of semiconductor elements mounted on a substrate via an adhesive layer in a two-dimensional arrangement; a resin layer formed on the substrate and located around the semiconductor elements, the resin layer having substantially the same thickness as a thickness of the semiconductor elements; an organic insulating layer formed over a surface of the resin layer and circuit formation surfaces of the semiconductor elements; a rearrangement wiring layer formed on the organic insulating layer and electrodes of the semiconductor chips; and external connection terminals electrically connected to the circuit formation surfaces of the semiconductor elements through wiring in the rearrangement wiring layer.

There is provided according to another aspect of the present invention a manufacturing method of a semiconductor device which packages a plurality of semiconductor elements, comprising the steps of: forming a resin layer having a thickness equal to a thickness of the semiconductor elements to be mounted; forming openings in the resin layer by partially removing the resin layer; locating the semiconductor elements within the openings, respectively, with circuit formation surfaces facing upward; forming an organic insulating layer over a surface of the resin layer and the circuit formation surfaces of the semiconductor elements; forming a rearrangement wiring layer on the organic insulating layer and electrodes of the semiconductor elements; and forming external connection terminals on the rearrangement wiring layer, the external connection terminals being connected to the electrodes of the semiconductor elements through wiring in the rearrangement wiring layer.

According to the above-mentioned invention, the circuit formation surfaces of the semiconductor elements and the surface of the resin layer are located substantially in the same plane (substantially at the same level) since the thickness of the resin layer surrounding the semiconductor elements is substantially equal to the thickness of the semiconductor elements. Thus, the rearrangement wiring layer can be easily formed on the semiconductor elements.

Additionally, there is provided according to another aspect of the present invention a stacked semiconductor device comprising a plurality of layer structures stacked one on another, each of the layer structure comprising: a semiconductor element arranged on a substrate via an adhesive layer; a resin layer formed on the substrate and surrounding the semiconductor element, the resin layer having a thickness substantially equal to a thickness of the semiconductor element; an organic insulating layer formed over a surface of the resin layer and a circuit formation surface of the semiconductor element; and a rearrangement wiring layer formed on the semiconductor element and electrodes of the semiconductor element.

Additionally, there is provided according to another aspect of the present invention a manufacturing method of a stacked semiconductor device, comprising the steps of: forming a first resin layer on a substrate, the first resin layer having a thickness substantially equal to a thickness of a first semiconductor element to be mounted, the first resin layer surrounding the first semiconductor element; forming a first opening in the first resin layer so that the first semiconductor element is located in the first opening; locating the first semiconductor element in the first opening; forming a first organic insulating layer over a surface of the first resin layer and a circuit formation surface of the first semiconductor element; forming a first rearrangement wiring layer on the first organic insulating layer and electrodes of the first semiconductor element; forming a second resin layer on the first rearrangement wiring layer, the second resin layer having a thickness substantially equal to a thickness of a second semiconductor element to be mounted, the second resin layer surrounding the second semiconductor element; forming a second opening in the second resin layer so that the second semiconductor element is located in the second opening; locating the second semiconductor element in the second opening; forming a second organic insulating layer over a surface of the second resin layer and a circuit formation surface of the second semiconductor element; forming a second rearrangement wiring layer on the second organic insulating layer; electrically connecting the first rearrangement wiring layer to the second rearrangement wiring layer by forming conductive connection parts extending through the second resin layer between the first rearrangement wiring layer and the second rearrangement wiring layer.

According to the above-mentioned invention, the circuit formation surfaces of the semiconductor elements and the surface of the resin layer are located substantially in the same plane (substantially at the same level) since the thickness of the resin layer surrounding the semiconductor elements is substantially equal to the thickness of the semiconductor elements. Thus, the rearrangement wiring layer can be easily formed on the semiconductor elements. Additionally, since the rearrangement wiring layers extend to the surface of the resin layer, electrical connection between the rearrangement wiring layers can be easily achieved by conductive connection parts such as vias.

Additionally, there is provided according to another aspect of the present invention a semiconductor device comprising: a substrate; a semiconductor element mounted on the substrate; and a resin layer provided around the semiconductor element and having an upper surface substantially at the same level with an upper surface of the semiconductor element, wherein the resin layer is a half-curable resin having a characteristic that the resin is softened and fluidized when heated in a half-cured state, and the resin layer is in close contact with side surfaces of the semiconductor element with no gap formed therebetween.

Additionally, there is provided according to another aspect of the present invention a manufacturing method of a semiconductor device, comprising the steps of: forming a resin layer of a half-cured state on a substrate so that a semiconductor element is positioned in the resin layer, the resin layer made of a half-curable resin;

fluidizing the filing resin layer of the half-cured state by heating; eliminating a gap between the semiconductor element and the filing resin layer by filling the fluidized filing resin layer in the gap; and completely curing the resin layer by heating.

According to the above-mentioned invention, by using the half-curable resin as a material of the resin layer, a gap between the semiconductor element and the resin layer can be filled by the softened and fluidized resin layer. Thus, a semiconductor device having no gap between the semiconductor element and the resin layer can be easily manufactured.

Additionally, there is provided according to another aspect of the present invention a manufacturing method of a semiconductor device, comprising the steps of: forming a resin layer having an opening on a substrate and preparing a semiconductor element provided with an adhesive formed of a half-curable resin; locating the semiconductor element in the opening; pressing the semiconductor element onto the substrate via the adhesive while fluidizing the adhesive of the half-cured state by heating; and curing the adhesive by heating while maintaining the semiconductor element at a position where an upper surface of the semiconductor element lies substantially in the same plane where an upper surface of the filing resin layer lies.

Additionally, there is provided according to another aspect of the present invention a manufacturing method of a semiconductor device, comprising the steps of: forming a resin layer having an opening on a substrate and preparing a semiconductor element provided with an adhesive; locating the semiconductor element in the opening by supporting an upper surface of the semiconductor element by a bottom surface of a bonding tool; and curing the adhesive in a state where the bottom surface of the bonding tool is in contact with an upper surface of the resin layer.

According to the above-mentioned invention, a gap between the semiconductor element and the resin layer can be filled by the adhesive, and the upper surface of the semiconductor element and the upper surface of the filing resin layer can be accurately set substantially in the same plane. Additionally, since an appropriate amount of adhesive is applied and the adhesive fills the gap by being pressed by the semiconductor element. Thus, the adhesive can be brought into close contact with the substrate and insufficient wet or a climbing up phenomenon of the adhesive can be prevented.

Other objects, features and advantages of the present invention will become more apparent from the following detailed description when read in conjunction with the accompanying drawings.

BRIEF DESCRIPTION OF THE DRAWINGS

FIG. 6 is a cross-sectional view of a part of a semiconductor device having a capacitor formed in a rearrangement wiring layer;

FIG. 7A is a cross-sectional view of a semiconductor device having an inductor formed in a rearrangement wiring layer;

FIG. 7B is a plan view of the inductor shown in FIG. 7A;

FIG. 18 is a cross-sectional view of a semiconductor device incorporating the semiconductor device shown in FIG. 1 in a package;

FIGS. 20A and 20B are cross-sectional views for explaining an example of formation of the filing resin layer;

FIGS. 21A and 21B are cross-sectional views for explaining another example of formation of the filing resin layer;

FIG. 22 is a cross-sectional view for explaining a relationship between the filing resin layer and a thickness of a semiconductor element;

FIGS. 25A and 25B are cross-sectional views showing a manufacturing process of a semiconductor device according to a seventh embodiment of the present invention;

FIGS. 26A through 26C are views for explaining a process of applying an adhesive to a semiconductor element and set the adhesive in a half-cured state; and FIGS. 27A and 27B are cross-sectional views for explaining a method of setting an upper surface of a resin layer and an upper surface of a semiconductor element substantially in the same plane.

DETAILED DESCRIPTION OF THE PREFERRED EMBODIMENTS

A description will now be given of a first embodiment of the present invention.

Figure 1:
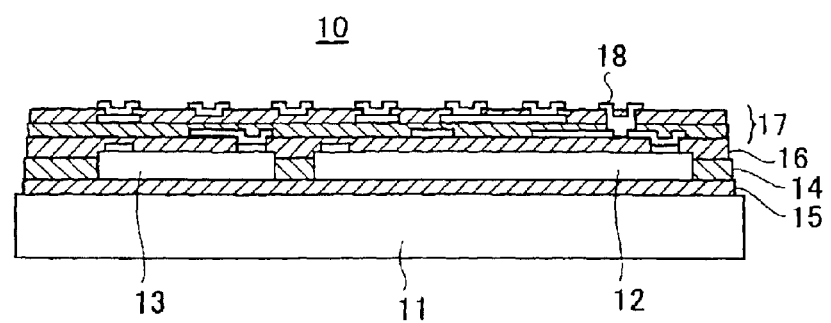
FIG. 1 is a cross-sectional view of a semiconductor device according to a first embodiment of the present invention.

FIG. 1 is a cross-sectional view of a semiconductor device 10 according to the first embodiment of the present invention. The semiconductor device 10 has a structure 11 in which a plurality of semiconductor chips (or semiconductor elements) are mounted on a substrate such as a silicon wafer and input/output terminals (external connection terminals) are formed on wiring provided on the semiconductor chips.

The substrate 11 is not limited to a silicon wafer, and a substrate formed of a material having a good thermal conductivity, which can serve as a heat-radiating plate, may be used so as to promote heat radiation of the semiconductor chips.

Although the semiconductor chips mounted on the substrate 11 include a logic chip 12 arid a memory chip 13 in the example shown in FIG. 1, an arbitrary number of semiconductor chips having various functions may be mounted on the substrate 11. However, it is preferable that the semiconductor chips to be mounted are thin semiconductor chips having a thickness of 50 $\mu$m or less.

The logic tip 12 and the memory chip 13 (hereinafter, may be simply referred to as semiconductor chips 12 and 13) are mounted on the substrate 11 through an adhesive layer 15 in a state where they are located in a resin layer 14. Here, in the present embodiment, after the logic tip 12 and the memory chip 13 are mounted on the resin layer 14 by being located in openings formed in the resin layer 14 after forming the resin layer.

That is, the adhesive layer 15 is first formed on the substrate 11, and, then, the resin layer 14 is formed on the adhesive layer 15. The resin layer 14 is formed to have a thickness the same as the thickness of the semiconductor chips 12 and 13 to be mounted. The resin layer 14 is formed of a photosensitive resin, and openings 14a for accommodating the semiconductor chips 12 and 13 are formed using a photo-etching technique. The opening 14a has a depth, which penetrates the resin layer 14, and a surface of the adhesive layer 15 is exposed on the bottom of the openings 14a. Additionally, each of the openings 14a is formed in the size to which the respective one of the semiconductor chips 12 and 13 fits exactly.

The semiconductor chips 12 and 13 are located in the thus-formed openings 14a of the resin layer 14 with the circuit formation surfaces facing upward. After the semiconductor chips 12 and 13 are located in the openings 14a, the back surfaces of the semiconductor chips 12 and 13 are bonded to the adhesive layer 15 so that the semiconductor chips 12 and 13 are fixed in the openings 14a. In this state, the circuit formation surfaces of the semiconductor chips 12 and 13 are in a state of being aligned with the surface of the resin layer 14. Namely, the circuit formation surfaces of the semiconductor chips 12 and 13 and the surface of the resin layer 14 are leveled.

In the present embodiment, the thickness of each of the semiconductor chips 12 and 13 is set to 50 $\mu$m or less. Although a thickness of a semiconductor chip usually contains about 10% of allowable tolerance, such an unevenness (that is, flatness) may not affect formation of a rearrangement wiring layer in the subsequent process since 10% of 50 $\mu$m is only 5 $\mu$m. Therefore, in the present invention, it is important to make a semiconductor chip to be mounted thin.

After mounting the semiconductor chips 12 and 13, an organic insulating film 16 such as polyimide or epoxy are formed on the leveled circuit formation surfaces and the surface of the resin layer 14, and the rearrangement wiring layer 17 is formed thereon. The rearrangement wiring layer 17 is formed by alternatively stacking conductive layers and insulating layers and connecting between the conductive layers by vias or the like and can be formed using a known technique in this field, and, thus, a description thereof will be omitted.

Thus, a semiconductor device achieving a complete function can be constituted by connecting the logic tip 12 and the memory chip 13 by the rearrangement wiring layer 17 so that, for example, the logic tip 12 can perform computation using the data of the memory chip 13 and the result is stored in the memory chip 13. After forming the input/output terminals 18 as external connection terminals on the surface of the rearrangement wiring layer 17, the semiconductor device shown in FIG. 1 is completed.

In the semiconductor device 10 according to the present embodiment, since the thin semiconductor chips are located in the resin layer 14 having the thickness equal to the thickness of the semiconductor chips, it is not necessary to perform separately a process of leveling the circuit formation surfaces and the surfaces of the resin layer, and a flatness required for formation of the rearrangement wiring layer 17 can be achieved only by locating the semiconductor chips 12 and 13 in the openings 14a of the resin layer 14.

Additionally, since the resin layer 14 is processed by photo-etching so as to form the openings 14a, the location and size of the openings 14a are controllable with high accuracy. Therefore, the semiconductor chips 12 and 13 can be positioned with sufficient accuracy. Moreover, since the resin layer 14 is formed before mounting the semiconductor chips 12 and 13, the positions of the semiconductor chips 12 and 13 after mounting do not shift due to contraction of the resin at the time of curing the resin.

When forming a plurality of semiconductor devices 10 on a silicon wafer as the substrate 10 of the semiconductor device 10 according to the present embodiment, the silicon wafer is cut by dicing after the semiconductor devices are formed on the silicon wafer so as to individualize the semiconductor devices 10. In this case, a dicing tape is applied onto the backside of the silicon wafer, and the dicing is performed from the front side of the silicon wafer.

Thus, in the present embodiment, a part which corresponds to a dicing line in an upper part from the adhesive layer 15 to the resin layer 14, i.e., a part along which a dicing saw passes, is not formed or removed beforehand so that what is necessary is to cut only the silicon wafer by the dicing saw. Additionally, edges of each of the resin layer 14, the organic insulating layer 16 and the rearrangement wiring layer 17 which are formed by being sequentially stacked on the adhesive layer 15 is located inside the edges of the immediately lower layer (left and right sides of the semiconductor device 10 of FIG. 1 being offset stepwisely inward) so that these layers do not contact the dicing saw. Thereby, efficient dicing can be performed.

Figure 2:
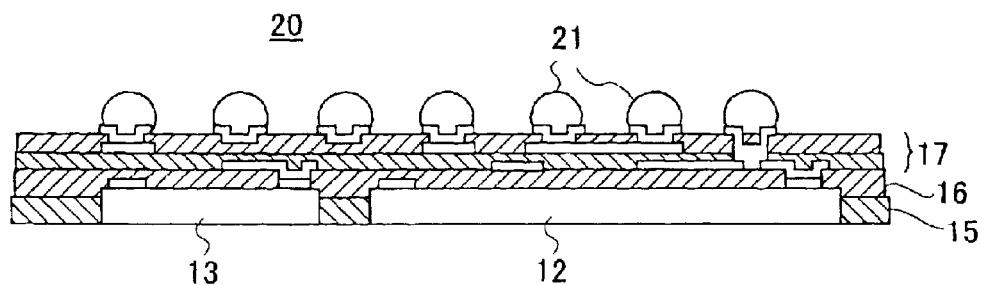
FIG. 2 is a cross-sectional view of a semiconductor device, which is a variation of the semiconductor device shown in FIG. 1.

FIG. 2 is a cross-sectional view of a semiconductor device 20, which is a variation of the semiconductor device 10 shown in FIG. 1. Although the semiconductor device 20 has a structure similar to that of the semiconductor device 10, the substrate 11 and the adhesive layer 15 are removed and solder balls 21 are formed as external connection terminals on the input/output terminals 18.

In a case where the substrate 11 is removed, the substrate 11 can be efficiently removed by being made thin by grinding and dissolving the substrate 11 and the adhesive layer 15 by etching or the like. It should be noted that, after removing the substrate 11, a heat-radiating plate may be provided on the back surfaces of the semiconductor chips 12 and 13.

Figure 3:
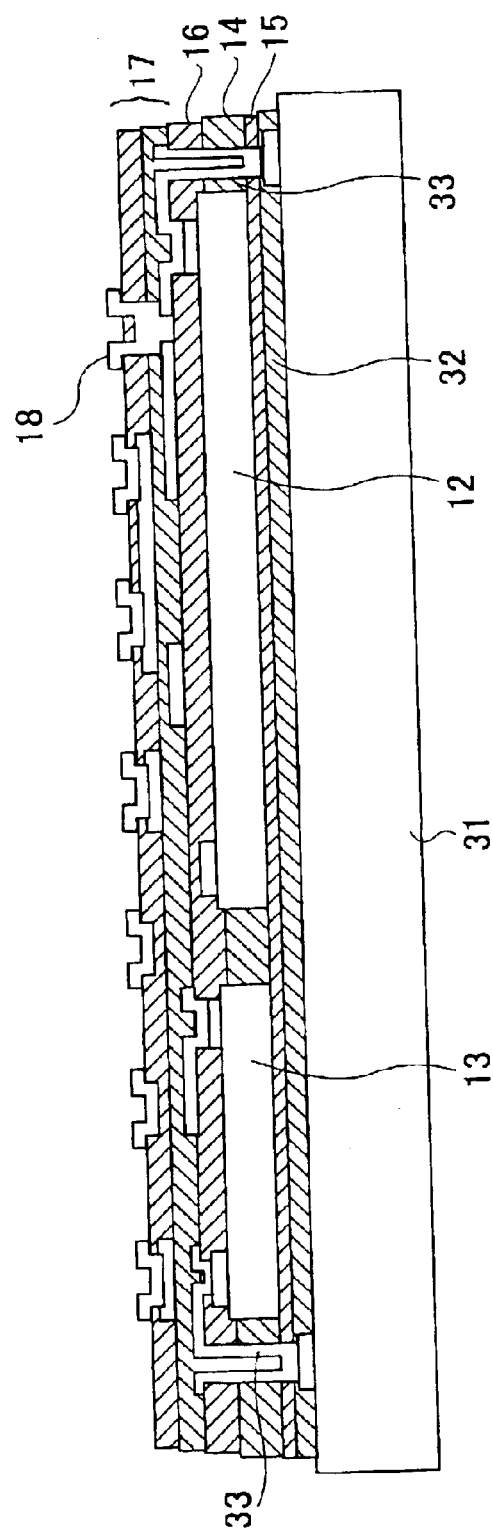
FIG. 3 is a cross-sectional view of a semiconductor device, which is another variation of the semiconductor device shown in FIG. 1.
Figure 4:
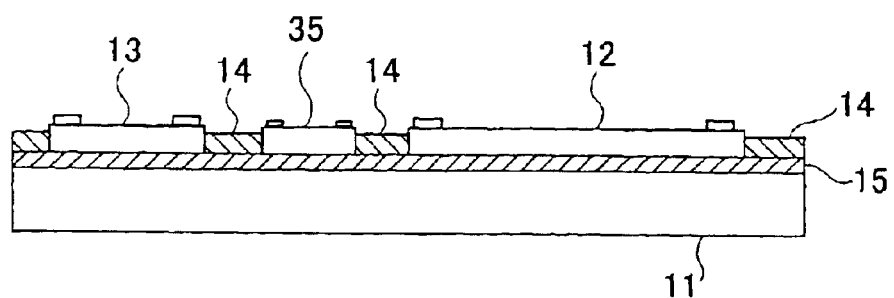
FIG. 4 is a cross-sectional view of a semiconductor device having a dummy chip.

FIG. 3 is a cross-sectional view of a semiconductor device 30, which is a variation of the semiconductor device 10 shown in FIG. 1. Although the semiconductor device 30 has a structure similar to that of the semiconductor device 10, a semiconductor chip (LSI) 31 is used instead of the substrate 11.

That is, an insulating layer 32 is formed on the LSI 31, and the adhesive layer 15 is formed on the insulating layer 32. Thereafter, formation is performed in the same manner as the above-mentioned semiconductor device 10. Additionally, the electrodes on the circuit formation surfaces of the semiconductor chips 12 and 13 and the electrodes of the LSI 31 are electrically connected to each other by vias 33, which is formed to penetrate the resin layer 14 and the adhesive layer 15.

According to the semiconductor device 30, a plurality of semiconductor chips can be mounted to the semiconductor device with higher density, and a semiconductor device having a higher function can be achieved.

In the above-mentioned embodiment, when an interval between the semiconductor chips is large, a length of the resin layer 14 between the semiconductor chips (12 and 13) is large. In such a case, a stress tends to be generated in the semiconductor device due to a difference in coefficients of thermal expansion between a resin layer and the semiconductor chips and the substrate 11. Then, in such a case, the length of the resin layer 14 is reduced by arranging a dummy chip 35 in a large space between the semiconductor chips so as to attempt relaxation of the stress.

Figure 5:
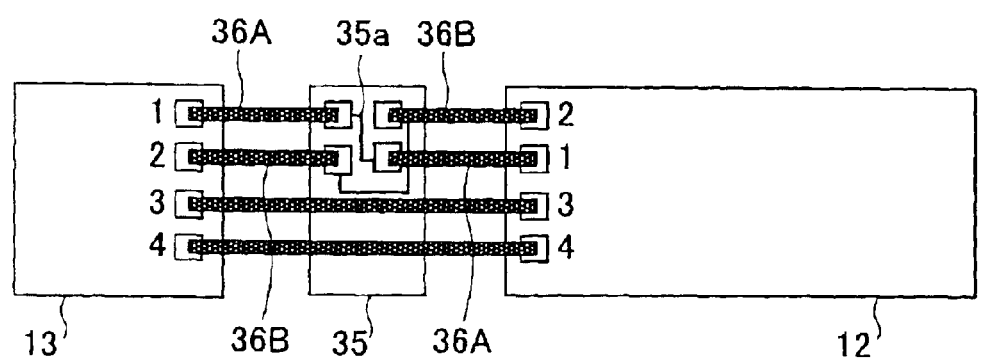
FIG. 5 is a plan view of the dummy chip and adjacent semiconductor chips.

Additionally, the wiring configuration of the rearrangement wiring layer 17 can also be simplified by providing wiring in the dummy tip, as shown in FIG. 5. In the example shown in FIG. 5, the adjacent wires 36A and 36B cross each other by a wire 35a in the dummy chip 35.

In the present invention, passive elements such as a capacitor or an inductor may be formed in the rearrangement wiring layer 17. FIG. 6 is a cross-sectional view showing an example in which a capacitor is formed in the rearrangement wiring layer 17. FIG. 7A is a cross-sectional view showing an example in which a capacitor is formed in the rearrangement wiring layer 17, and FIG. 7B is a plan view of the capacitor.

As shown in FIG. 6, the capacitor 37 can be formed by providing a dielectric layer 38 between the conductive layers in the rearrangement wiring layer 17. Additionally, as shown in FIG. 7B, the inductor 39 can be formed by making the conductive layer in the rearrangement wiring layer 17 into a spiral form. Thus, noise entering the interior of the semiconductor device can be suppressed by providing the capacitor and the inductor in the rearrangement wiring layer 17.

Figure 8:
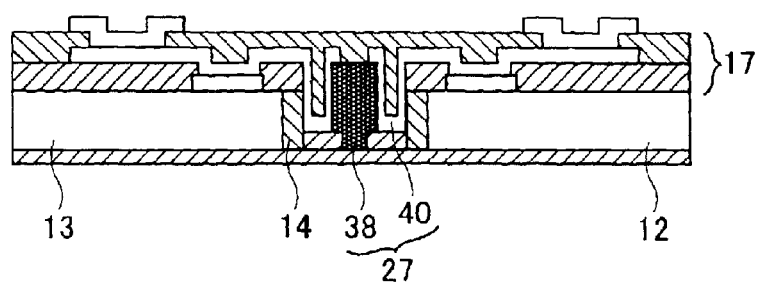
FIG. 8 is a cross-sectional view of a part of a semiconductor device having a capacitor formed in a resin layer.

Additionally, in the present invention, as shown in FIG. 8, the capacitor 27 can also be provided in the resin layer 14. In this case, a dielectric member 38 is filled in an opening formed in the resin layer 14, and conductive layers 40 are formed on each side of the rearrangement wiring layer 17.

Figure 9:
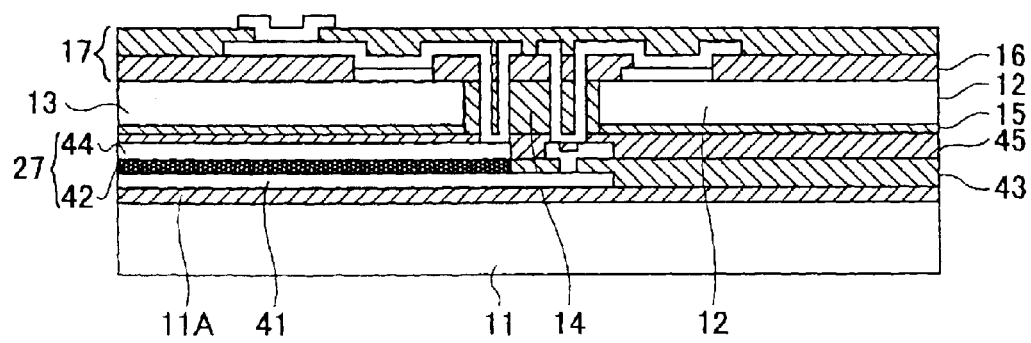
FIG. 9 is a cross-sectional view of a part of a semiconductor device having a capacitor formed between a substrate and a semiconductor chip.

Further, as shown in FIG. 9, the capacitor can also be formed between the substrate 11 and the semiconductor chips 12 and 13. In this case, an insulating layer is first formed on the substrate 11, and a conductive layer 41 is formed on the insulating layer 40 at the location at which the capacitor 27 is formed. Then, a dielectric layer 42 is formed on the conductive layer 41, and the conductor layer 41 and the dielectric layer 42 are embedded into an insulating layer 43. Next, a conductive layer 44 is formed on the dielectric layer 42, and the conductive layer 44 is embedded into an insulating layer 45. Thereby, the dielectric layer 42 is interposed between the conductive layer 41 and the conductive layer 44, which results in formation of the capacitor 27. Thereafter, the adhesive layer 15 is formed on the insulating layer 45, and the semiconductor chips 12 and 13 are mounted in the same manner as the above-mentioned semiconductor device 10, and the rearrangement wiring layer 17 is formed.

Figure 10:
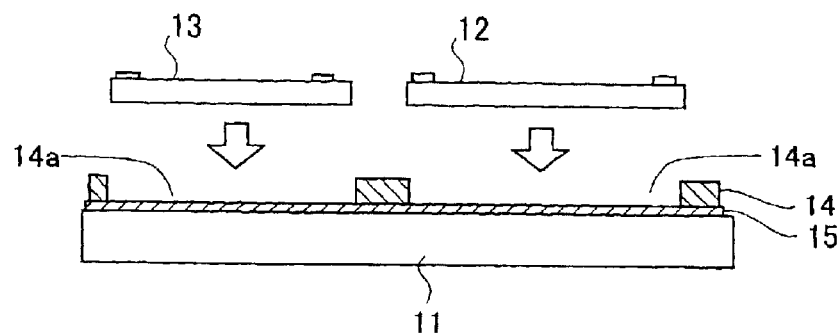
FIG. 10 is an illustration showing a mounting process of semiconductor chips.
Figure 11:
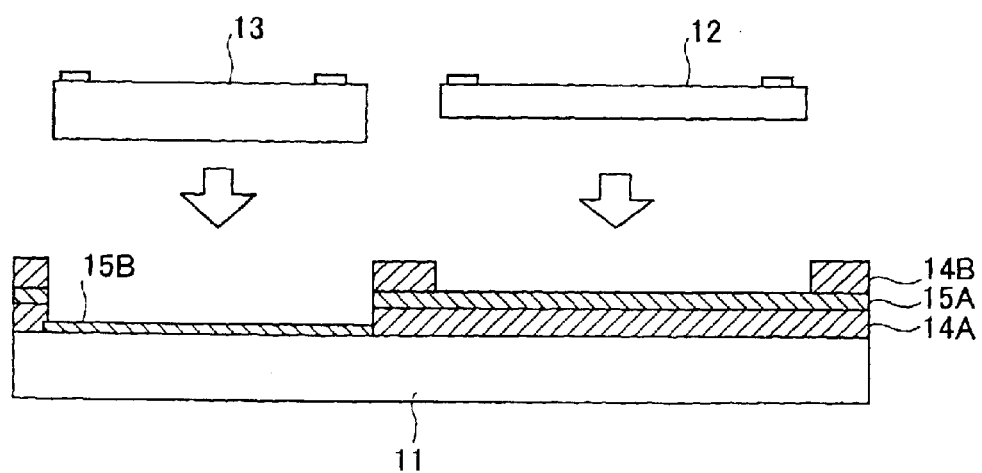
FIG. 11 is a cross-sectional view of a semiconductor device showing a mounting process of semiconductor chips having different thickness.

A description will now be given, with reference to FIG. 10, of a mounting process of the semiconductor chips 12 and 13. FIG. 10 is an illustration showing the mounting process of the semiconductor chips 12 and 13.

First, the adhesive layer 15 is formed on the substrates 11 such as a silicon wafer. The adhesive layer 15 is formed by a resin, which has adherence onto the surface thereof. Next, the resin layer 14 is formed on the adhesive layer 15. The resin layer 14 is formed of a photosensitive resin, and is formed over almost the entire surface of the adhesive layer 15. However, as mentioned above, the resin layer 14 are formed so that the edges thereof are located inside the edges of the adhesive layer located underneath. Additionally, the thickness of the resin layer is set substantially equal to the thickness of the semiconductor chips.

Thereafter, openings 14a are formed in the resin layer 14 by photo-etching the resin layer 14. Then, the semiconductor chips 12 and 13 are arranged in the openings 14a. Thereby, the semiconductor chips 12 and 13 are mounted on the substrate 11 in a state where the circuit formation surfaces of the semiconductor chips 12 and 13 and the surface of the resin layer 14 are substantially at the same level.

Here, when the thickness of the semiconductor chip 12 and the semiconductor chip 13 differ greatly, a resin layer 14A which has a thickness corresponding to the difference in the thickness is first formed on the substrate 11, and, then, an adhesive layer 15A is applied thereon. Then, a resin layer 14B is formed further on the adhesive layer 15A. Thereafter, the opening 14a in which the semiconductor chip with larger thickness is arranged is formed so that the substrate 11 is exposed, and the opening 14a in which the semiconductor chip with smaller thickness is arranged is formed so that adhesive layer 15A is exposed. Moreover, an adhesive layer 15B is formed in the opening 14a in which the semiconductor chip with larger thickness is arranged. Thereby, semiconductor chips having different thickness can be mounted on the substrate 11 so that the circuit formation surfaces are substantially at the same level.

Figure 12:
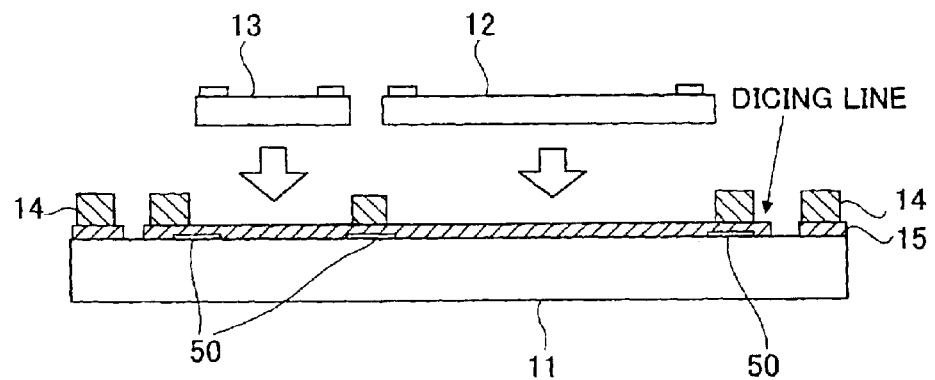
FIG. 12 is across sectional view of a semiconductor chip having alignment patterns for positioning semiconductor chips.

In the present embodiment, it is necessary to locate the semiconductor chips 12 and 13 with sufficient accuracy in the openings 14a of the resin layer 14. In order to facilitate such positioning, as shown in FIG. 12, it is preferable to form alignment patterns 50 for positioning the semiconductor chips on the substrate 11.

The alignment patterns 50 can be formed by forming titanium (Ti) or chromium (Cr) having good adhesion with silicon by depositing on the substrate 11 by a sputter method. The location of opening 14a of the resin layer 14 is determined on the basis of the alignment pattern 50. Then, in the case of mounting the semiconductor chips 12 and 13 on a substrate 11, the positions of the openings 14 are accurately detected by image recognition of the alignment patterns 50 and locate the semiconductor chips 12 and 13 at the detected positions.

Figure 13:
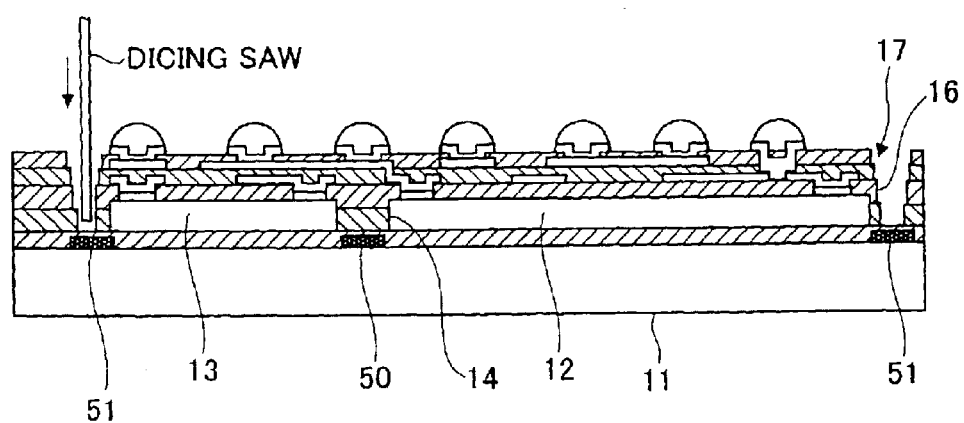
FIG. 13 is a cross-sectional view of a semiconductor device formed on a substrate having alignment patterns for recognizing dicing lines.

Additionally, as shown in FIG. 13, it is preferable to form alignment patterns 51 for dicing other than the alignment patterns for positioning the semiconductor chips. That is, the alignment patterns 51 are formed along the dicing line by the same manner as the alignment patterns 50, and the image of the alignment patterns 51 is recognized when carrying out the dicing so as to determine the dicing line. Furthermore, the positioning and processing of each layer including the resin layer 14 or the rearrangement wiring layer 17 formed on the substrate 11 can also be performed based on the alignment patterns 51.

A description will now be given, with reference to FIG. 14, of a second embodiment of the present invention. FIG.

14 is a cross-sectional view of a semiconductor device 60 according to the second embodiment of the present invention. The semiconductor device 60 shown in FIG. 14 is a so-called stack type semiconductor device in which a plurality of semiconductor chips are mounted by stacking.

First, a resin layer 61A is formed on the substrate 11 such as a silicon water, and an opening is formed in the resin layer 61A. The resin layer 61A is formed of a material the same as the material of the resin layer 14 of the above-mentioned first embodiment, and also the opening is formed in the same manner as the above-mentioned openings 14a. After forming the opening, an insulating adhesive layer 62A is formed in the opening, and a semiconductor chip 63A is arranged in the opening.

In this state, the semiconductor chip 63A is fixed by the insulated adhesive layer 62A, and the circuit formation surface of the semiconductor chip 63A aligns with the surface of the resin layer 61A. Similar to the above-mentioned first embodiment, it is preferable that the thickness of the semiconductor chip 63A is 50 μm. Next, an organic insulating film (layer) 64A is formed on the circuit formation surface of the semiconductor chip and the surface of the resin layer 61A, and, then, a conductive layer 65A is formed on the organic insulating layer 64A. The conductive layer 65A serves as a rearrangement wiring layer, and is formed so as to lead the electrodes of the semiconductor chip 63A to outside the semiconductor chip 63A.

Next, a resin layer 61B is formed on the conductive layer 65A and the resin layer 61A. The resin layer 61B is also formed of the same material as the above-mentioned resin layer 14, and an opening is formed similarly. Since the conductive layer 65A on semiconductor chip 65A is exposed in the opening, an insulating adhesive layer 62B is formed in the opening. Then, a semiconductor chip 63B is arranged in the opening of resin layer 61B. The semiconductor chip 63B is fixed by the insulating adhesive layer 62B, and the surfaces of the semiconductor chip 63B and the resin layer 61B are almost at the same level.

Next, an organic insulating layer 64B is formed in the circuit formation surface of the semiconductor chip and the surface of the resin layer 61B, and a conductive layer 65B is formed on the organic insulating n layer 64B. The conductive layer 65B serves as a rearrangement wiring layer, and is formed so that the electrodes of the semiconductor chip 63B are lead to outside the semiconductor chip 63B. Additionally, through holes may be formed in the resin layer 61B and, when the conductive layer 65B is formed, the conductive layer is formed also within the through holes (formation of so-called vias) so as to electrically connect the conductive layer 65B to the conductive layer 65A.

Similar to the above-mentioned method, a resin layer 61C and an insulating adhesive layer 62C are formed, a semiconductor chip 63C is arranged in an opening, and an organic insulating layer 64C and a conductive layer 65C are formed on the semiconductor chip 63C. The conductive layer 65C is electrically connected to a predetermined part of the conductive layer 65B.

Further, after forming a resin layer 61D in the same manner and forming an insulating adhesive layer 62D in an opening, a semiconductor chip 83D is mounted on a stacked state. Here, in the example shown in FIG. 14, the semiconductor chips 63A, 63B and 63C are of the same size, and the semiconductor chip 63D is smaller than the semiconductor chips 63A, 63B and 63C. The thickness of each of the semiconductor chips 63A–63D is preferably 50 μm or less.

An organic insulating layer 64D and a conductive layer 65D are formed on the semiconductor chip 63D. Input/output terminals are formed as external connection terminals on the conductive layer 65D. Bumps such as solder balls may be formed on the input/output terminals, or the input/output terminals may be connected to an external circuit by bonding wires.

In the semiconductor device 60 having the above-mentioned structure, the semiconductor chips 63A–63D are stacked via the organic insulating layers 64A–64D, the conductive layers 65A–65D and the insulating adhesive layers 62A–62D. In such a structure, is not necessary to form column-shaped conductive members such as metal pillars between the semiconductor chips, and distances between semiconductor chips can be made small. Therefore, the semiconductor device of the stack type having a reduced thickness can be formed easily. Additionally, since the electrodes on the semiconductor chips are lead to outside the semiconductor chips by the conductive layers 65A–65D and the conductive layers are electrically connected through vias, a semiconductor chip can be stacked on an area where the electrodes are arranged. That is, semiconductor chips having the same size can be stacked one on another.

Figure 14:
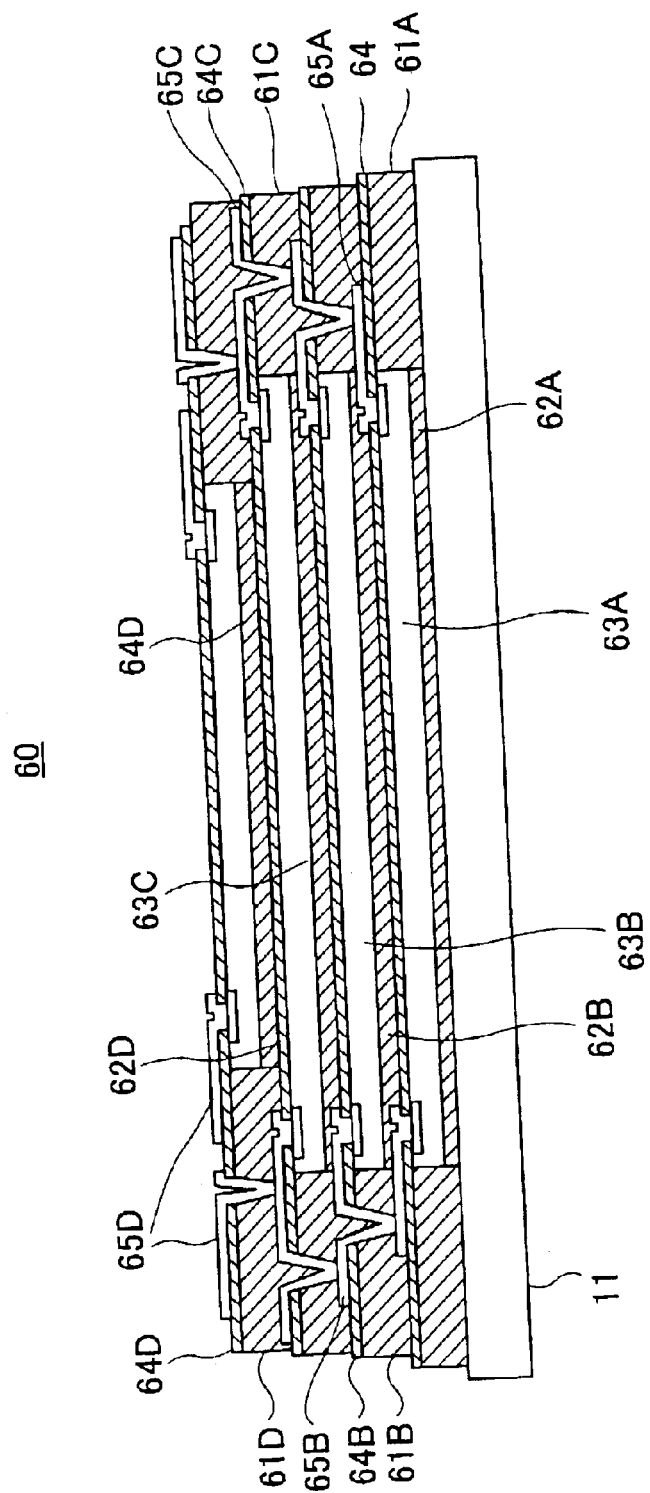
FIG. 14 is a cross-sectional view of a semiconductor device according to a second embodiment of the present invention.

Although, in the example shown in FIG. 14, although the semiconductor chips 63A, 63B and 63C of the same size and the smaller semiconductor chip 63D are stacked, the number of the semiconductor chips to be stacked is not limited and an arbitrary number of semiconductor chip may be stacked. Additionally, there is especially no limitation in the size of the semiconductor chip, and semiconductor chips can be stacked whether thy have the same size or different sizes.

Figure 15:
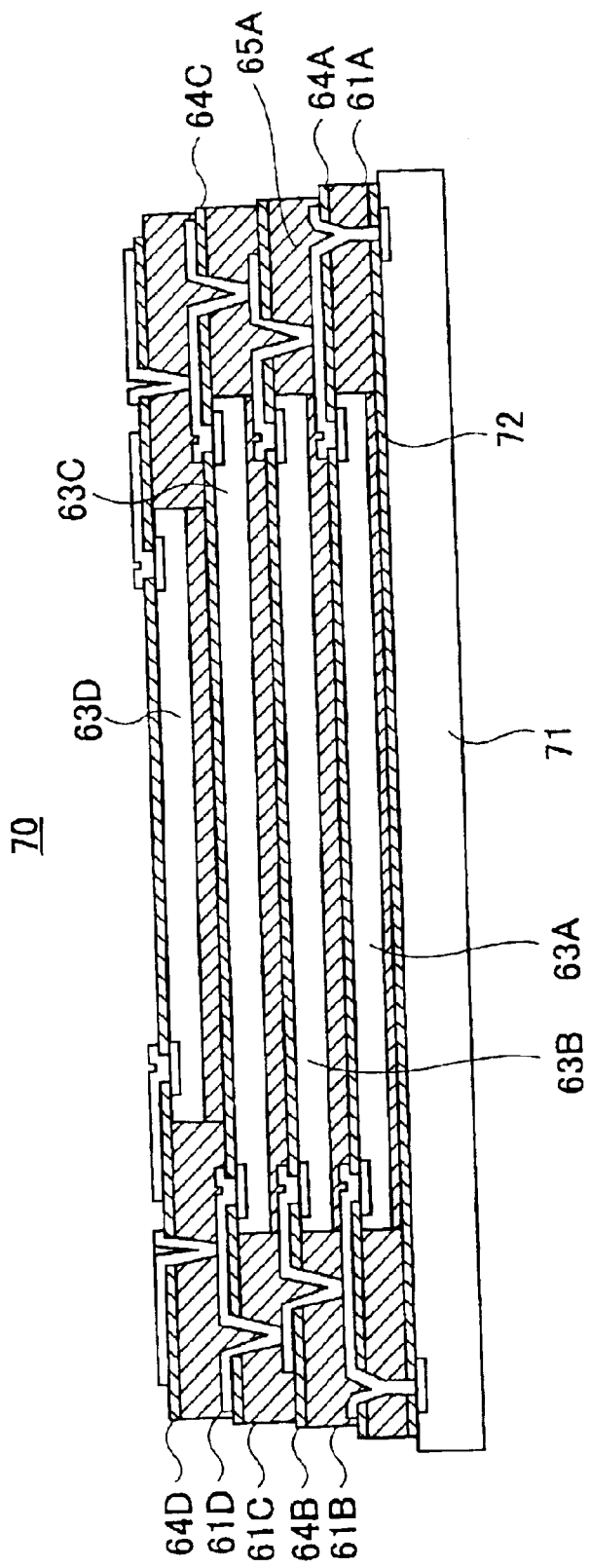
FIG. 15 is a cross-sectional view of a semiconductor device, which is a variation of the semiconductor device shown in FIG. 14.

FIG. 15 is a cross-sectional view of a semiconductor device 70, which is a variation of the semiconductor device 60 shown in FIG. 14. In FIG. 15, parts that are the same as the part shown in FIG. 14 are give the same reference numerals, and descriptions thereof will be omitted. Although the semiconductor device 70 shown in FIG. 15 has basically the same structure as the semiconductor device 60, the substrate 11 is replaced by a semiconductor chip 71.

That is, an organic insulating film (layer) 72 is formed on the semiconductor chip 71, and an upper resin layer 61A is formed on the organic insulating film 72 so as to stack a semiconductor chip 63A thereon. The semiconductor chip 71 has larger size than the semiconductor chip 63A, and the semiconductor chip 63D is arranged within the electrode arranging area of the semiconductor chip 71. Then, the conductive layer 65A formed on the semiconductor chip 63A and the electrodes on the semiconductor chip 71 are electrically connected through the resin layer 61A and the vias extending through the organic insulating film 72.

As mentioned above, according to the semiconductor device 70 shown in FIG. 15, semiconductor chips can be mounted with a higher density than the semiconductor device 60.

Figure 16:
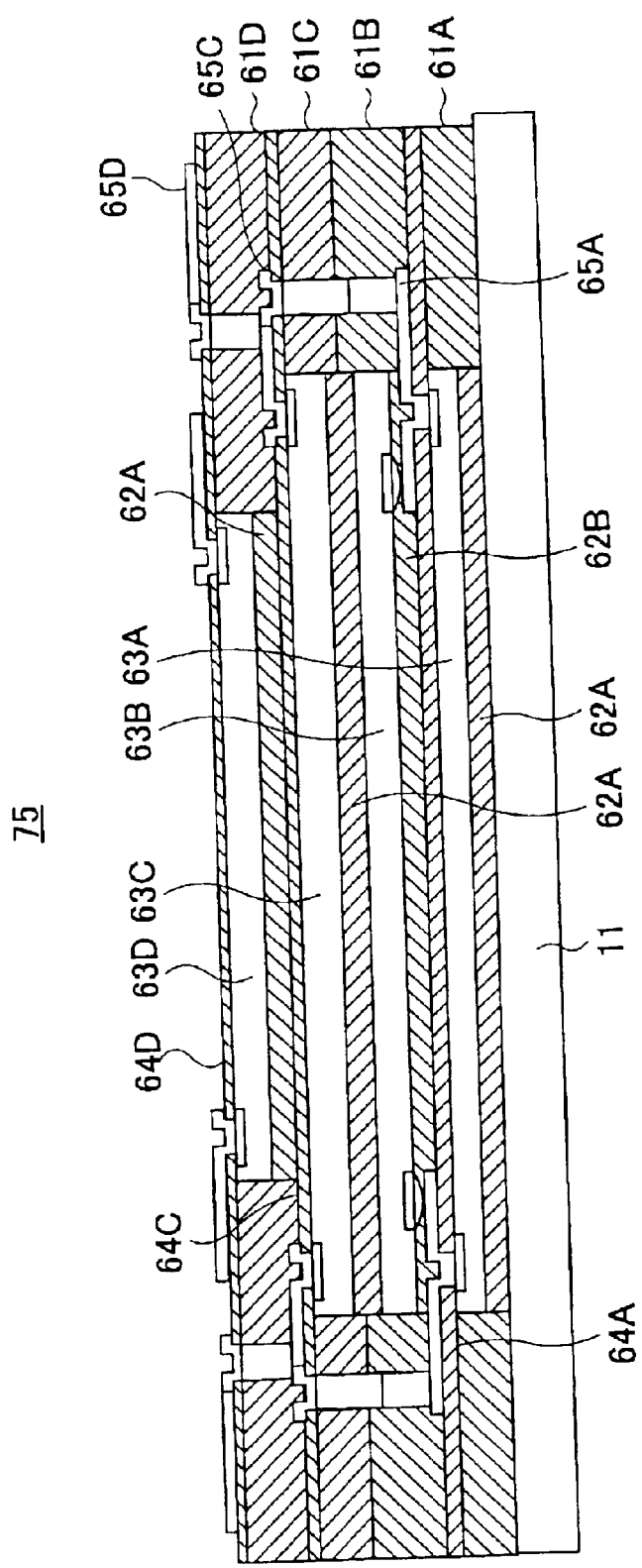
FIG. 16 is a cross-sectional view of a semiconductor device, which is another variation of the semiconductor device shown in FIG. 14.

FIG. 16 is a cross-sectional view of a semiconductor device 75, which is another variation of the semiconductor device 60 shown in FIG. 14. In FIG. 16, although the semiconductor device 80 has basically the same structure as the semiconductor device 60, there is a difference in that the semiconductor chip 63B is connected to the semiconductor chip 63A in a face-down state. According to the semiconductor device 80, formation of one layer in the rearrangement wiring layer can be omitted, and further the same size chips can be mounted.

Figure 17:
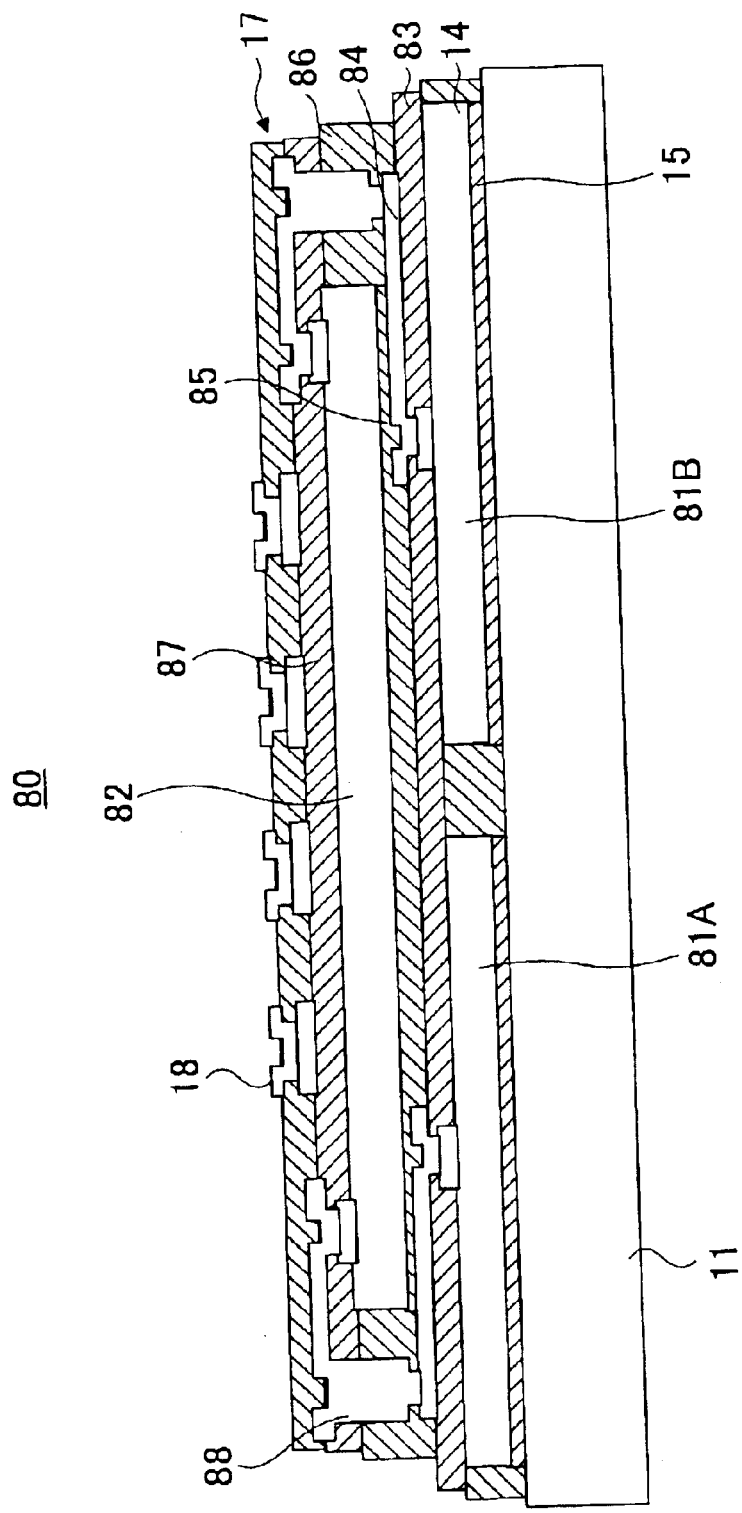
FIG. 17 is a cross-sectional view of a semiconductor device according to a third embodiment of the present invention.

A description will now be given, with reference to FIG. 17, of a semiconductor device according to a third embodiment of the present invention. FIG. 17 is a cross-sectional view of the semiconductor device according to the third embodiment of the present invention. The semiconductor device 80 shown in FIG. 17 is a so-called stacked type semiconductor device in which a plurality of semiconductor chips are mounted in a stacked state, wherein lower stage semiconductor chips 81A and 81B are mounted on a substrate 11 side by side and an upper stage semiconductor chip 82 is stacked on the semiconductor chips 81A and 81B.

That is, in the semiconductor device, similar to the semiconductor device 10 shown in FIG. 10, the semiconductor chips 81A and 81B are mounted on the substrate 11 via an adhesive layer 15, and a phenol novolac based resin layer 14 is provided around the semiconductor chips 81A and 81B. A phenol lovolac based organic insulating film (organic insulating layer) 83 is provided on the circuit formation surfaces of the semiconductor chips 81A and 81B and an upper surface of the resin layer 14. A conductive layer 84, which forms pattern wirings connected to electrodes of the semiconductor chips 81A and 81B, is formed on the organic insulating film 83.

The semiconductor chip 82 is mounted on the conductive layer and the organic insulating film via an adhesive layer 85, and a phenol novolak based resin layer 86 is provided around the semiconductor chip 82. Then, a phenol novolak based organic insulating layer 87 is provided on the circuit formation surface of the semiconductor chip 82 and an upper surface of the resin layer 86, and a rearrangement wiring layer 17 is formed on the organic insulating layer 87. The rearrangement wiring layer 17 and the conductive layer 84 are electrically connected by vias 88 which extend through the resin layer 86. Additionally, solder balls may be provided on input/output terminals 18 formed on the rearrangement wiring layer 17 as shown in FIG. 2 so as to form a ball grid array (BGA) type semiconductor device. Although the phenol novolak based resin and organic insulating film are use in the present embodiment, the present invention is not limited to the use of the phenol novolak based materials, and, for example, epoxy or polyimide based material may be use.

It should be noted that the semiconductor apparatus according to one of the above-mentioned first to third embodiments can be considered as a semiconductor chip so as to incorporate into a package. FIG. 18 is a cross-sectional view of a semiconductor device 90 that is formed by incorporating a structure similar to the semiconductor device 10 shown in FIG. 1 into a package.

In FIG. 18, the input/output terminals 18 of the semiconductor device 110 are arranged on a periphery of the upper surface of the semiconductor device 110. The semiconductor device 110 is mounted on a substrate 91 via the adhesive layer 15, and the input terminals 18 of the semiconductor device 110 and terminals (not shown in the figure) of the substrate 91 are electrically connected to each other by bonding wires 92. The semiconductor device 110 and the bonding wires 92 are encapsulated by a seal resin 93 on the substrate 91. Solder balls 94 as external connection terminals are provided on the back side of the substrate 91.

In the above-mentioned first to third embodiment, the insulating layer formed on the circuit formation surfaces of the semiconductor chips are the organic insulating films 16, 64A–64D, 72, 83, 87. The advantages of using the organic insulating film instead of an inorganic insulating film is as follows.

1) A surface of an organic insulating layer is easily made flat.

When an inorganic insulating layer is formed on a circuit formation surface, an unevenness due to existence of pattern wirings on the circuit formation surface is reflected in the surface of the inorganic insulating layer since the inorganic insulating layer is formed by a vapor deposition method which provides an isotropic growth of the film. Accordingly, it is difficult to obtain a flat surface when using an inorganic insulating layer. On the other hand, it is easy to form an organic insulating layer having a flat surface since the organic insulating layer is not formed by growth of material on the circuit formation surface.

2) A number of processes can be reduced.

The formation of an inorganic insulating film requires an etching process for patterning. Such an etching process can be omitted by pattering by a photolithography using a photosensitive organic insulating film.

3) An organic insulating film has a function of stress relaxation.

Since an inorganic insulating film is generally brittle, when a stacked type semiconductor device is formed using the inorganic insulating film, an effect of stress relaxation cannot be expected. On the other hand, an organic insulating film generally has a certain degree of flexibility, which provides the effect of stress relaxation in a state in which the organic insulating film is sandwiched between semiconductor chips.

A description will be given below of a specific method of setting a height of a semiconductor chip substantially the same as a height of a resin layer surrounding the semiconductor chip.

A description will now be given, with reference to FIGS. 19A and 19B, of a fourth embodiment of the present invention.

Figures 19A, 19B:
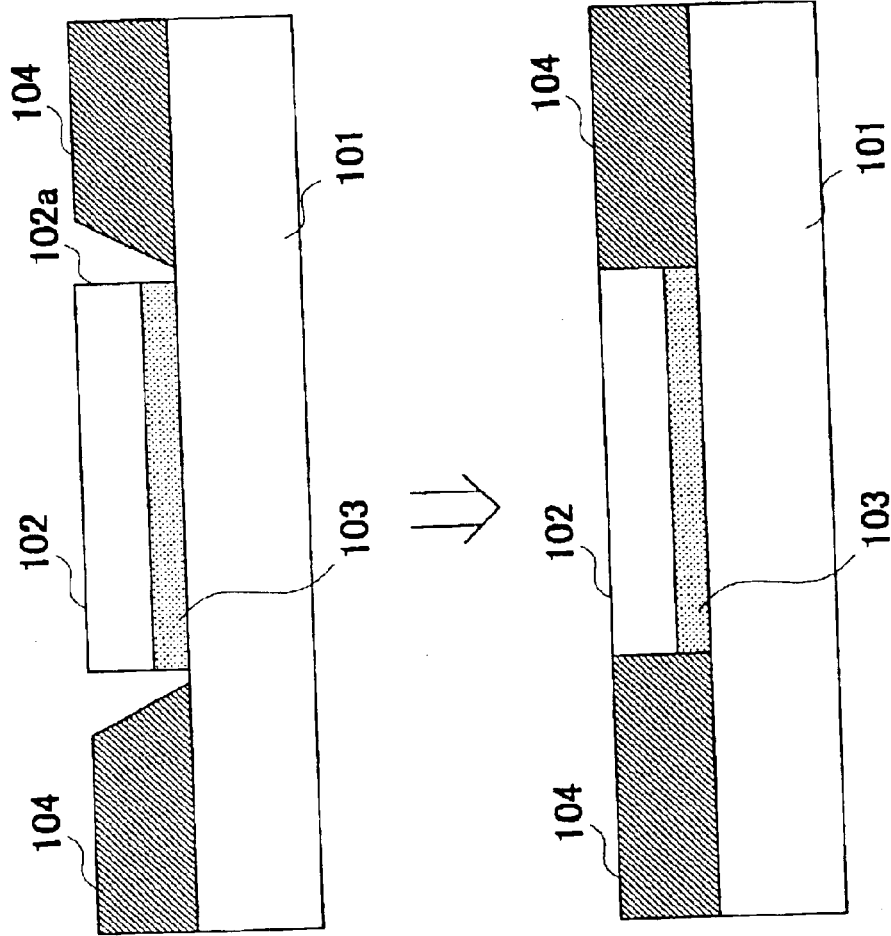
FIG. 19A is a cross-sectional view of a semiconductor device according to a fourth embodiment of the present invention in a middle of a manufacturing process.
FIG. 19B is a cross-sectional view of the semiconductor device shown in FIG. 19A in a state where the gap is filled by fluidizing a resin layer.

FIGS. 19A and 19B are views for explaining a manufacturing process of a semiconductor device according to the fourth embodiment of the present invention. FIG. 19A is a cross-sectional view showing a middle of the manufacturing process, wherein a gap is formed between a resin layer and a semiconductor element. FIG. 19B is a cross-sectional view of the semiconductor device in a state where the gap is filled by fluidizing the resin layer.

As shown in FIG. 19B, the semiconductor device according to the fourth embodiment of the present invention has a structure in which a semiconductor element 102 is mounted on a substrate 101. The semiconductor element 102 is fixed to the substrate 101 by an adhesive 103. The resin layer 104 is formed around the semiconductor element 102. The resin layer 104 is brought into close contact with the side surface of the semiconductor element 102, and no gap is formed therebetween.

In a state where the resin layer 104 is formed and the semiconductor element 102 is mounted on the substrate 101, as shown in FIG. 19A, a gap is formed between the resin layer 104 and the side surface 102a of the semiconductor element 102. In order to fill the gap, in the present embodiment, a so-called B-stage resin is used as a resin, which forms the resin layer 104. The B-stage resin is generally an epoxy resin and cure of the resin can be stopped in the middle of the process from a liquidized resin state to a completely cured state. The B-stage resin is referred to as a half-curable resin and a state where cure is stopped in the middle is referred to as a half-cured state. A rate of cure in the half-cured state is about 50%.

Although the B-stage resin is a solid state in the half-cured state, it softens by heating and comes to show fluidity. That is, the B-stage resin has a characteristic in which the resin is softens and fluidity is increased by heating in the half-cured state. Additionally, the B-stage resin can be completely cured by heating further, after it is heated in the half-cured state so as to increase fluidity and further heated.

In the present embodiment, the above-mentioned B-stage resin is used as a material, which forms the resin layer 104. In a state (state shown in FIG. 19A) where the resin layer 104 in the half-cured state is formed on the substrate 101 and the semiconductor element 102 is mounted on the substrate 101, the resin layer 104 flows into the gap between the side surface 102a of the semiconductor element 102 and the resin layer 104 by heating and fluidizing the resin layer 104, thereby filling the gap as shown in FIG. 19B. Then, the resin layer 104 is completely cured by heating the resin layer 104 further.

Therefore, the resin layer 104 is brought into close contact with the side surface of the semiconductor element 102, supports the semiconductor element 102 from the side surface, and can make fixation of the semiconductor element 102 more reliable.

Here, the resin layer 104 may be formed in the half-cured state after the resin layer 104 is mounted on the substrate 101 as shown in FIGS. 20A and 20B, or the resin layer 104 is previously formed in the half-cured state on the substrate 101 as shown in FIG. 103 and the semiconductor element 102 may be mounted on the substrate 101 by locating the semiconductor element 102 in an opening 104a as shown in FIGS. 21A and 21B. Additionally, the filing resin layer 104 in the half-cured state may be transferred onto the substrate 101 using a known print method.

Although the fluidity of the resin layer 104 in the half-cured state is increased by heating, the resin layer 104 does not freely flows as a liquid. Thus, if a width of a gap (G) is increased larger than a thickness (chip thickness Tc) of the semiconductor element 102, the gap cannot be completely filled even if the resin layer 104 is fluidized. In order to fluidize the resin layer 104 of a half-cured state so as to eliminate the gap between the semiconductor elements 102 completely, as shown in FIG. 22, it is preferable that the thickness (chip thickness Tc) of the semiconductor element 102 is larger than the width of the gap (G), i.e., Tc>G.

As for the B-stage resin, which forms the resin layer 104, it is preferable that the temperature (softening point) at which fluidity appears in the half-cured state is 60° C. or higher. This is because if a softening point is lower than 60° C., there is a possibility that the resin layer 104 may flow at a room temperature or a temperature during a production process.

In consideration of the thickness of the adhesive 103 which is provided between the substrates so as to fix the semiconductor element 102 and in order to make the height of the resin layer 104 after being completely cured and the height of the semiconductor element 102 at substantially the same level. The thickness of the preferably greater than the thickness of the semiconductor element 102 by 5 $\mu$m to 20 $\mu$m.

Although the B-stage epoxy resin is used as the resin layer in the above-mentioned embodiment, novolak resin or phenol resin, for example, or the like may be used if it shows the same characteristics.

A description will now be given, with reference to FIGS. 23A through 23D, of a semiconductor device according to a fifth embodiment of the present invention. FIGS. 23A through 23D are cross-sectional views for explaining a manufacturing process of the semiconductor device according to the fifth embodiment of the present invention. In the semiconductor device according to the fifth embodiment of the present invention, an upper surface 104b of the resin layer 104 and an upper surface 102b of the semiconductor element 102 lie substantially in the same plane.

Figure 23A:
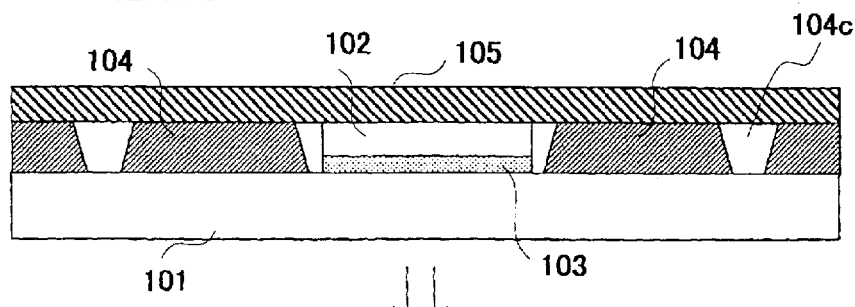
FIGS. 23A through 23D are cross-sectional views for explaining a manufacturing process of a semiconductor device according to a fifth embodiment of the present invention.
Figure 23B:
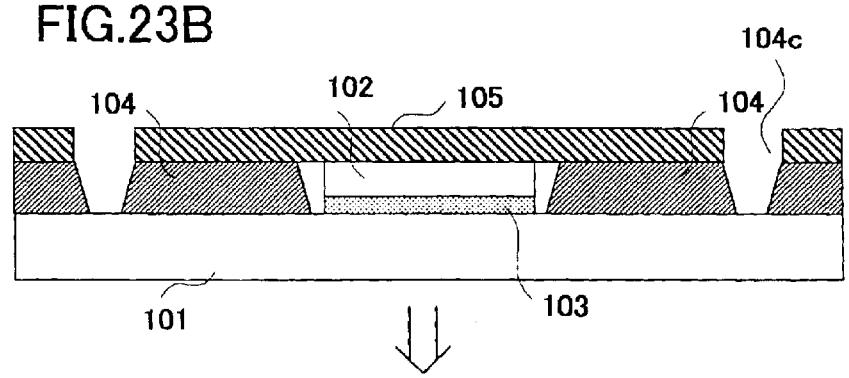

First, similar to the above-mentioned fourth embodiment, the resin layer 104 of the half-cured state is formed on the substrate 101, and the semiconductor element 102 is mounted on the substrate 101. Here, through holes 104c such as via holes used in a subsequent process are formed in the resin layer 104 of a half-cured state. Next, as shown in FIG. 23A, a photosensitive film 105 is applied over the resin layer 104 and the semiconductor element 102. In the present embodiment, in order to form the thorough holes 104c in the resin layer 104, it is preferable that the resin layer 104 does not flow in the portions where the through holes 104c are provided. Thus, as shown in FIG. 23B, portions of the photosensitive film 105 covering the through holes 104c are exposed to a light and removed.

That is, a portion of the resin layer 104 which is not necessarily fluidized is made uncovered by the photosensitive film 105.

Figure 23C:
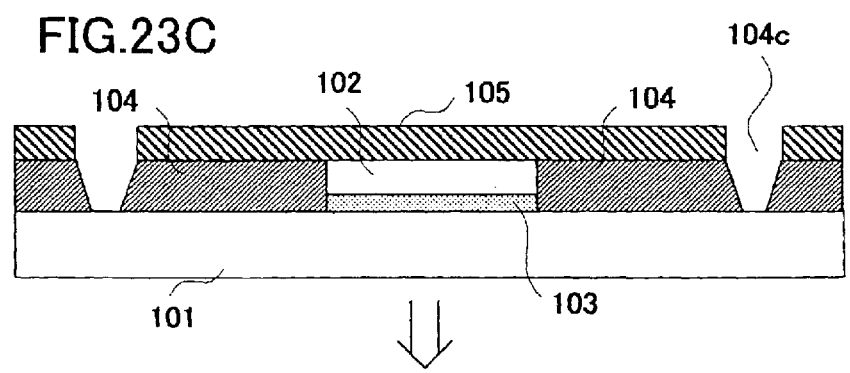

Then, the resin layer 104 of the half-cured state is heated so as to be fluidized as shown in FIG. 23C. Accordingly, the gap covered by the photosensitive film 105 is filled by the fluidized resin layer 104, and the gap is eliminated. On the other hand, in the portions of the through holes 104c which are not covered by the photosensitive film 105, the resin layer 104 hardly flows and the through holes 104c, such as the through holes connecting the conductive layers 65B and 65C shown in FIG. 14, are not closed. That is, fluidization of the resin layer 104 can be promoted by covering the resin layer 104 by a tape or a f lm.

Figure 23D:
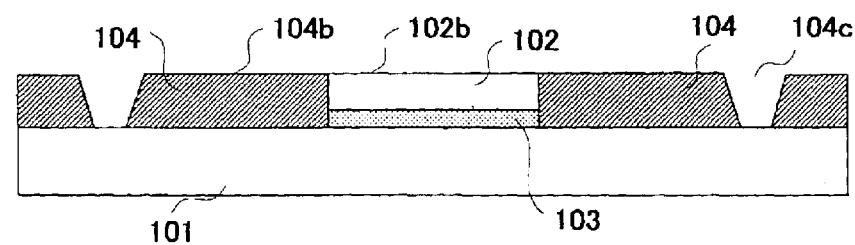

Thereafter, as shown in FIG. 23D, the resin layer 104 is completely cured and the photosensitive film 105 is removed by peeling. In this state, there is no gap between the semiconductor element 102 and the resin layer 104, and the upper surface 102b of the semiconductor element 102 and the upper surface 104b of the resin layer 104 lie substantially in the same plane. Additionally, the through holes 104c formed in the resin layer 104 in the half-cured state remain the same.

It should be noted that it was discovered through experiments that the filing resin layer 104 does not flow in the portion, which is not covered by the photosensitive film 105, and the specific reason for the phenomenon is not clear. However, the phenomenon is sufficiently reproducible, and can be carried out practically without problems.

Additionally, although the photosensitive film 105 is used so as to provide openings at positions (through holes 104c) corresponding to the portions in which the resin layer is not necessarily fluidized in the above-mentioned embodiment, a film or a tape other than the photosensitive film may be used if it is not necessary. For example, a dicing tape may be applied onto the filing resin layer 104.

Figure 24:
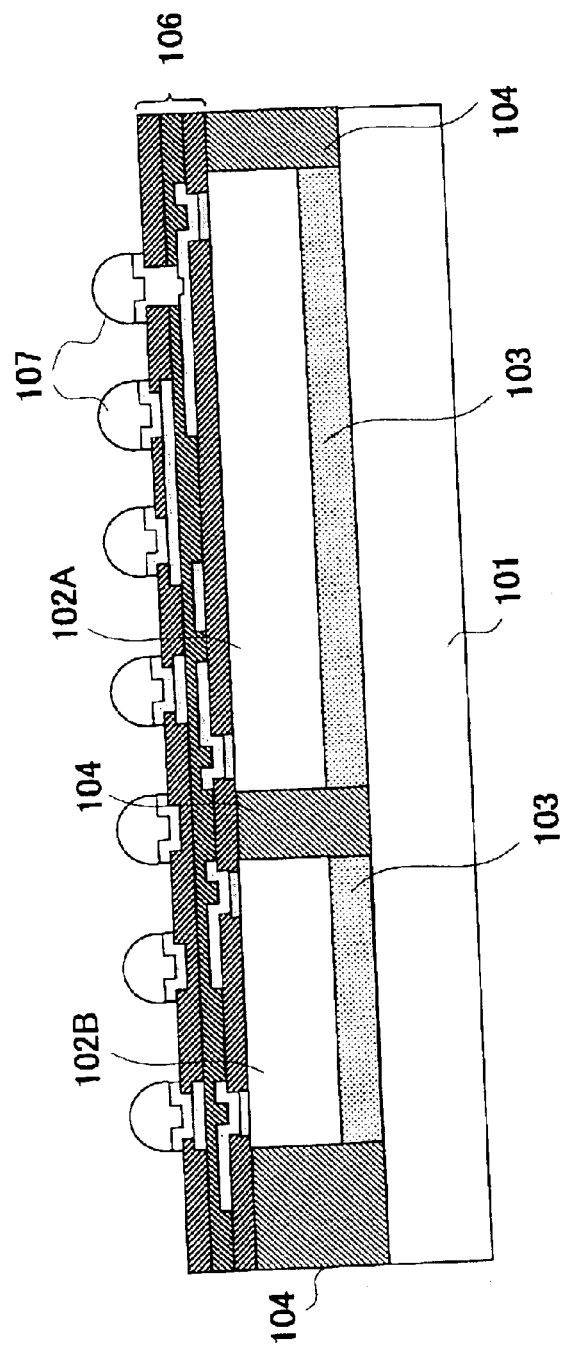
FIG. 24 is a cross-sectional view of a semiconductor device according to a sixth embodiment of the present invention.

A description will now be given, with reference to FIG. 24, of a semiconductor device according to a sixth embodiment of the present invention. FIG. 24 is a cross-sectional view of the semiconductor device according to the fourth embodiment of the present invention.

The semiconductor device according to the sixth embodiment of the present invention is a multi chip module, which has a plurality of semiconductor elements (two semiconductor elements 102A and 102B are shown in FIG. 24). Each of the semiconductor elements 102A and 102B is in mounted on the substrate 101 by the adhesive 103 in a state where the circuit formation surface facing upward.

The resin layer 104 is provided between and around the semiconductor elements 102A and 102B, and the upper surface of the resin layer 104 and the upper surface (circuit formation surface) of each of the semiconductor elements 102A and 102B lie substantially in the same plane. The resin layer 104 is formed of the same material as that described in the above-Mentioned fourth embodiment, and is brought into close contact with side surfaces of each of the semiconductor elements 102A and 102B. Moreover, a wiring layer 106, which is formed by stacking insulating layers and conductive layers, is formed over the circuit formation surfaces of the semiconductor elements 102A and 102B, and the upper surface of the resin layer 104, and solder balls 107 as external connection terminals are provided on an upper surface of the wiring layer 106. The electrodes provided on the circuit formation surface of each of the semiconductor elements 102A and 102B are electrically connected to the corresponding solder balls 107 through wiring in the wiring layer 106. It should be noted that the formation of the wiring layer can be carried out using a known semiconductor manufacturing technique, and descriptions thereof will be omitted.

The thickness of the semiconductor elements 102A and 102B is about 50 $\mu$m, and the thickness of the adhesive 3 is about 5 $\mu$m to about 20 $\mu$m. Therefore, the upper surfaces (circuit formation surfaces) of the semiconductor elements 102A and 102B, and the upper surface of the resin layer 104 can be substantially in the same plane by forming the resin layer 104 to have a thickness of 50 $\mu$m+(5 to 20) $\mu$m. Since the thickness of the adhesive 103 does not depend on the thickness of the semiconductor element, the upper surface (circuit formation surface) of the semiconductor element and the upper surface of the resin layer 104 can be lied substantially in the same plane (substantially at the same level) by setting the thickness of the resin layer 104 to be (thickness of the semiconductor element)+(5 to 20 $\mu$m).

It should be noted that in the above-mentioned embodiment, the adhesive is provided for fixing the back surfaces of the semiconductor elements 102A and 102B, and is not applied to the circuit formation surfaces. For this reason, the adhesive 103 does not need a special characteristic, and can be made by the same material as the resin layer 104. In this case, in the process of fluidizing the resin layer 104, the adhesive 103 can also be fluidized, which further improves the close contact between the adhesive 103 and the resin layer 104.

A description will now be given, with reference to FIGS. 25A and 25B, of a semiconductor device according to a seventh embodiment of the present invention. The semiconductor device according to the seventh embodiment of the present invention uses a resin having the half-cured characteristic similar to that of the above-mentioned fifth embodiment as an adhesive for fixing a semiconductor element onto a substrate.

First, as shown in FIG. 25A, an opening 108a is formed in a resin layer 108 formed on the substrate 101, and the semiconductor element 102 is located in the opening 108a. Unlike the above-mentioned embodiments, the resin layer 108 is in a completely cured state. An adhesive 103A of the same material as the above-mentioned resin layer 104 is applied to the back surface of the semiconductor element 102 beforehand, and is set in the half-cured state.

Next, a bonding tool 110 is moved downward while fluidizing the adhesive 103A by heating as shown in FIG. 25B. Under such circumstances, the adhesive 103A is pressed by the semiconductor element 102 and flows, and enters between the semiconductor element 102 and the side surfaces 108b of the resin layer 108. Since the adherence of the fluidized resin layer 108 to the substrate 101 increases, the semiconductor element 102 can be bonded to the substrate 101. Then, the downward movement of the bonding tool 110 is stopped at a position where the lower surface of the bonding tool 110 contacts the upper surface 108c of the resin layer 108, and in this state the adhesive 103A is heated at 200° C. or more so as to almost completely cure (90% or more) the adhesive 103A.

According to the above-mentioned method, a gap between the semiconductor element 102 and the resin layer 108 can be filled by the adhesive 103A, and the upper surface of the semiconductor element 102 and the upper surface 108c of the resin layer 108 can be accurately located substantially in the same plane.

Additionally, since the lower surface of the bonding tool 110 presses the resin layer 108 by being brought into contact with the upper surface of the resin layer 108, the it semiconductor element 102 is prevented from being deformed due to contraction of the adhesive 103A at the time of curing. Further, the adhesive 103A is applied by an amount by which the gap can be filled up, and fills the gap by the pressing force by the semiconductor element 102, the adhesive 103A is brought into close contact with the substrate 101, which prevents insufficient wet by the adhesive or a climbing-up phenomenon of the adhesive.

A description will now be given, with reference to FIGS. 26A through 26C, of a process which applies the adhesive 103A to the semiconductor element 102 shown in FIGS. 25A and 25B and setting the adhesive in the half-cured state.

First, as shown in FIG. 26A, circuits are formed on a wafer 109 so as to form a plurality of semiconductor elements on the wafer 109. Next, as shown in FIG. 26B, the adhesive 103A is applied onto the back surface, which is opposite to the circuit formation surface, of the wafer 109, and the adhesive 103A is cured at a temperature below 100° C. so as to set the adhesive in the half-cured state. By curing the adhesive 103A at a temperature below 100° C., it becomes possible to apply the method according to the present embodiment also to a semiconductor element using a thin wafer having a thickness of about 50 μm. Then, as shown in FIG. 24C, the wafer 109 is individualized so as to separate into the semiconductor elements 102 having the adhesive 103A on the back surfaces thereof. This state corresponds to the semiconductor element 102 supported by the bonding tool 110 shown in FIG. 25A.

It should be noted that the method in which the adhesive is cured while the bottom surface of the bonding tool 110 is brought into contact with the upper surface 108c of the resin layer 108 as mentioned above is applicable even if it is not the adhesive of the half-cured state. That is, even if the adhesive for fixing the semiconductor element 102 to the substrate 101 is not the B-stage resin but a normal resin, the effect can be obtained that the upper surface of the semiconductor element 102 and the upper surface 108c of the resin layer 108 can be accurately located substantially in the same plane.

First, an opening 108a is formed in the resin layer 108 formed on the substrate 101, and the semiconductor element 102 is arranged in the opening 108a. The resin layer 108 is in a completely cured state. A normal adhesive 103B is beforehand applied to the back surface of the semiconductor element 102. Next, as shown in FIG. 27A, the bonding tool 110 is moved downward and stopped at a position where the bottom surface of the bonding tool 110 contacts the upper surface 108c of the resin layer 108. In this state, the adhesive 103B is heated so as to be completely cured. When the bonding tool 110 is separated from the upper surface 108c of the resin layer 108 after adhesive 103B is cured, the upper surface 108c of the resin layer 108 and the upper surface of the semiconductor element 102 are accuracy located in substantially the same plane (substantially at the same level) as shown in FIG. 27B.

The present invention is not limited to the specifically disclosed embodiments, and variations and modifications may be made without departing from the scope of the present invention.

What is claimed is:

1. A semiconductor device, comprising:
   a plurality of semiconductor elements mounted on a substrate via an adhesive layer in a two-dimensional arrangement;
   a resin layer formed on said substrate and located around the semiconductor elements, the resin layer having substantially the same thickness as a thickness of the semiconductor elements;
   an organic insulating layer formed over a surface of the resin layer and circuit formation surfaces of the semiconductor elements;
   a rearrangement wiring layer formed on the organic insulating layer and electrodes of said semiconductor chips; and
   external connection terminals electrically connected to the circuit formation surfaces of said semiconductor elements through wiring in the rearrangement wiring layer.

2. The semiconductor device as claimed in claim 1, wherein a thickness of said semiconductor elements is 50 μm or less.

3. The semiconductor device as claimed in claim 1, wherein said resin layer is formed of a photosensitive resin material.

4. The semiconductor device as claimed in claim 1, wherein solder balls are formed on said external connection terminals.

5. The semiconductor device as claimed in claim 1, wherein said substrate and said adhesive layer are removed so that back surfaces of said semiconductor elements are exposed.

6. The semiconductor device as claimed in claim 1, wherein said substrate and said adhesive layer are removed, and a heat-radiating plate is provided on back surfaces of said semiconductor chips.

7. The semiconductor device as claimed in claim 1, wherein said substrate is replaced by a semiconductor element for substrate, and said plurality of semiconductor elements are mounted on a circuit formation surface of said semiconductor element for substrate via an organic insulating layer.

8. The semiconductor device as claimed in claim 1, wherein a dummy chip is located between adjacent ones of said plurality of semiconductor elements, the dummy chip having substantially the same thickness as said semiconductor elements and formed of the same material as said semiconductor elements.

9. The semiconductor device as claimed in claim 8, wherein said dummy chip has wiring therein, and a part of wiring in said rearrangement wiring layer is connected to the wiring in said dummy chip.

10. The semiconductor device as claimed in claim 1, wherein at least one passive element is formed in said rearrangement wiring layer.

11. The semiconductor device as claimed in claim 10, wherein said passive element is one of a capacitor or an inductor.

12. The semiconductor device as claimed in claim 1, wherein a capacitor is formed in said resin layer.

13. The semiconductor device as claimed in claim 1, wherein a capacitor is formed between said substrate and one of said semiconductor chips.

14. The semiconductor device as claimed in claim 1, wherein alignment patterns for position recognition are formed on said substrate.

15. The semiconductor device as claimed in claim 1, wherein said substrate is formed by individualizing a wafer, and edges of each of layers stacked on said substrate are sequentially offset inward from side surfaces of said substrate.

16. The semiconductor device as claimed in claim 1, wherein said plurality of semiconductor elements include semiconductor elements having different thickness; one of the semiconductor elements having a maximum thickness is located on said adhesive layer; and each of the semiconductor elements other than said semiconductor element having the maximum thickness is mounted on said substrate via a resin layer having a thickness corresponding to a difference in thickness between said each of the semiconductor elements and said one of the semiconductor elements having the maximum thickness.

* * * * *